United States Patent
Kang et al.

(10) Patent No.: US 10,755,932 B2
(45) Date of Patent: Aug. 25, 2020

(54) METHOD OF MANUFACTURING INTEGRATED CIRCUIT DEVICE

(71) Applicant: Samsung Electronics Co., Ltd., Suwon-si, Gyeonggi-do (KR)

(72) Inventors: Dong-woo Kang, Ansan-si (KR); Ji-ho Yoo, Seongnam-si (KR); Dong-hoon Khang, Daegu (KR); Seon-bae Kim, Hwaseong-si (KR); Moon-han Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 58 days.

(21) Appl. No.: 16/037,652

(22) Filed: Jul. 17, 2018

(65) Prior Publication Data

US 2019/0139771 A1    May 9, 2019

(30) Foreign Application Priority Data

Nov. 6, 2017    (KR) .................. 10-2017-0146792

(51) Int. Cl.
*H01L 21/336*    (2006.01)
*H01L 29/66*    (2006.01)
(Continued)

(52) U.S. Cl.
CPC ...... *H01L 21/266* (2013.01); *H01L 21/26513* (2013.01); *H01L 21/76224* (2013.01);
(Continued)

(58) Field of Classification Search
CPC .......... H01L 21/823431; H01L 29/785; H01L 21/32139; H01L 21/823412; H01L 21/0337; H01L 21/266
See application file for complete search history.

(56) References Cited

U.S. PATENT DOCUMENTS 6,355,546 B1    3/2002 Huang et al.
7,371,695 B2    5/2008 Lee et al.
(Continued)

FOREIGN PATENT DOCUMENTS

KR    10-2010-0042941 A    4/2010
KR       10-1037485 B1    5/2011

OTHER PUBLICATIONS

Sheldon, Brian. (1996). Silicon Nitride Oxidation Based on Oxynitride Interlayers with Graded Stoichiometry. Journal of the American Ceramic Society. 79. 2993-2996.*

*Primary Examiner* — Bradley Smith
*Assistant Examiner* — David J Goodwin
(74) *Attorney, Agent, or Firm* — Harness, Dickey & Pierce, P.L.C.

(57) ABSTRACT

To manufacture an integrated circuit device, a diffusion buffer layer and a carbon-containing layer are sequentially formed on a plurality of fin-type active regions formed in a substrate. A carbon-containing mask pattern is formed to have an opening exposing a portion of the diffusion buffer layer by etching the carbon-containing layer using an etching gas including an oxygen atom while the diffusion buffer layer is blocking oxygen from diffusing into the fin-type active regions. Impurity ions are implanted into some fin-type active regions through the opening and the diffusion buffer layer using the carbon-containing mask pattern as an ion-implantation mask, the some fin-type active regions being selected from among the plurality of fin-type active regions.

20 Claims, 31 Drawing Sheets

(51) Int. Cl.
   *H01L 29/78*     (2006.01)
   *H01L 21/266*    (2006.01)
   *H01L 21/8234*   (2006.01)
   *H01L 21/265*    (2006.01)
   *H01L 21/762*    (2006.01)
   *H01L 21/8238*   (2006.01)
   *H01L 27/11*     (2006.01)
   *H01L 21/027*    (2006.01)
   *H01L 21/033*    (2006.01)

(52) U.S. Cl.
   CPC ........ *H01L 21/823431* (2013.01); *H01L 21/823481* (2013.01); *H01L 21/823493* (2013.01); *H01L 21/823821* (2013.01); *H01L 21/823878* (2013.01); *H01L 21/823892* (2013.01); *H01L 27/1104* (2013.01); *H01L 21/0275* (2013.01); *H01L 21/0276* (2013.01); *H01L 21/0332* (2013.01); *H01L 21/76229* (2013.01)

(56) References Cited

U.S. PATENT DOCUMENTS

| | | | |
|---|---|---|---|
| 8,629,535 B2 | 1/2014 | Huang et al. | |
| 9,305,802 B2* | 4/2016 | Kim | H01L 21/31111 |
| 9,412,838 B2* | 8/2016 | Wang | H01L 29/66537 |
| 9,634,143 B1* | 4/2017 | Wahl | H01L 21/82389 |
| 2009/0047789 A1* | 2/2009 | Jung | H01L 21/0337 |
| | | | 438/694 |
| 2009/0283912 A1 | 11/2009 | Akinmade-Yusuff et al. | |
| 2012/0031875 A1 | 2/2012 | Hosoya et al. | |
| 2013/0109188 A1* | 5/2013 | Kim | H01L 21/31122 |
| | | | 438/710 |
| 2015/0104947 A1* | 4/2015 | Kim | H01L 21/31111 |
| | | | 438/703 |
| 2016/0141387 A1* | 5/2016 | Tseng | H01L 29/66537 |
| | | | 257/401 |
| 2016/0358911 A1* | 12/2016 | Chen | H01L 21/82341 |

\* cited by examiner

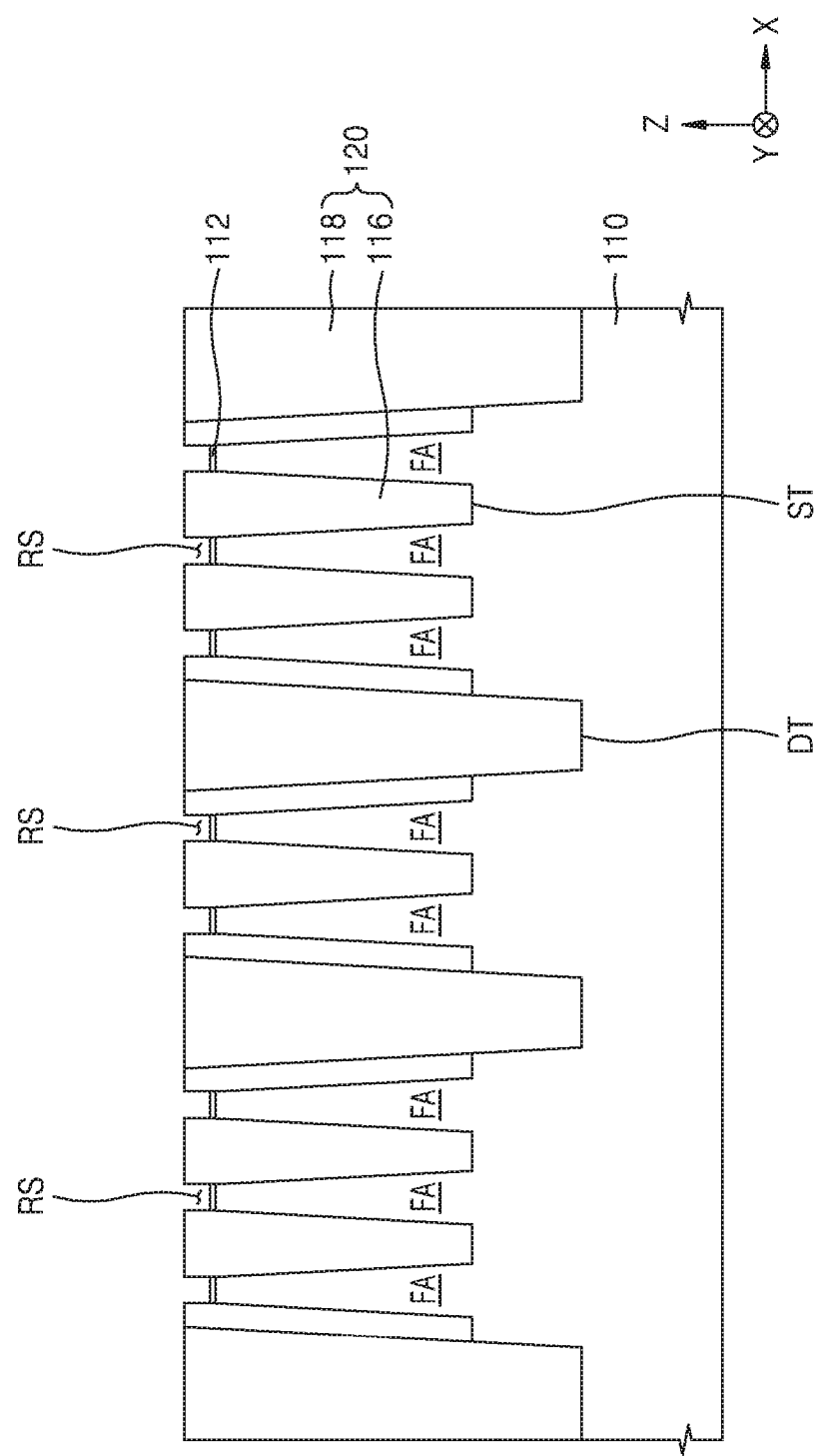

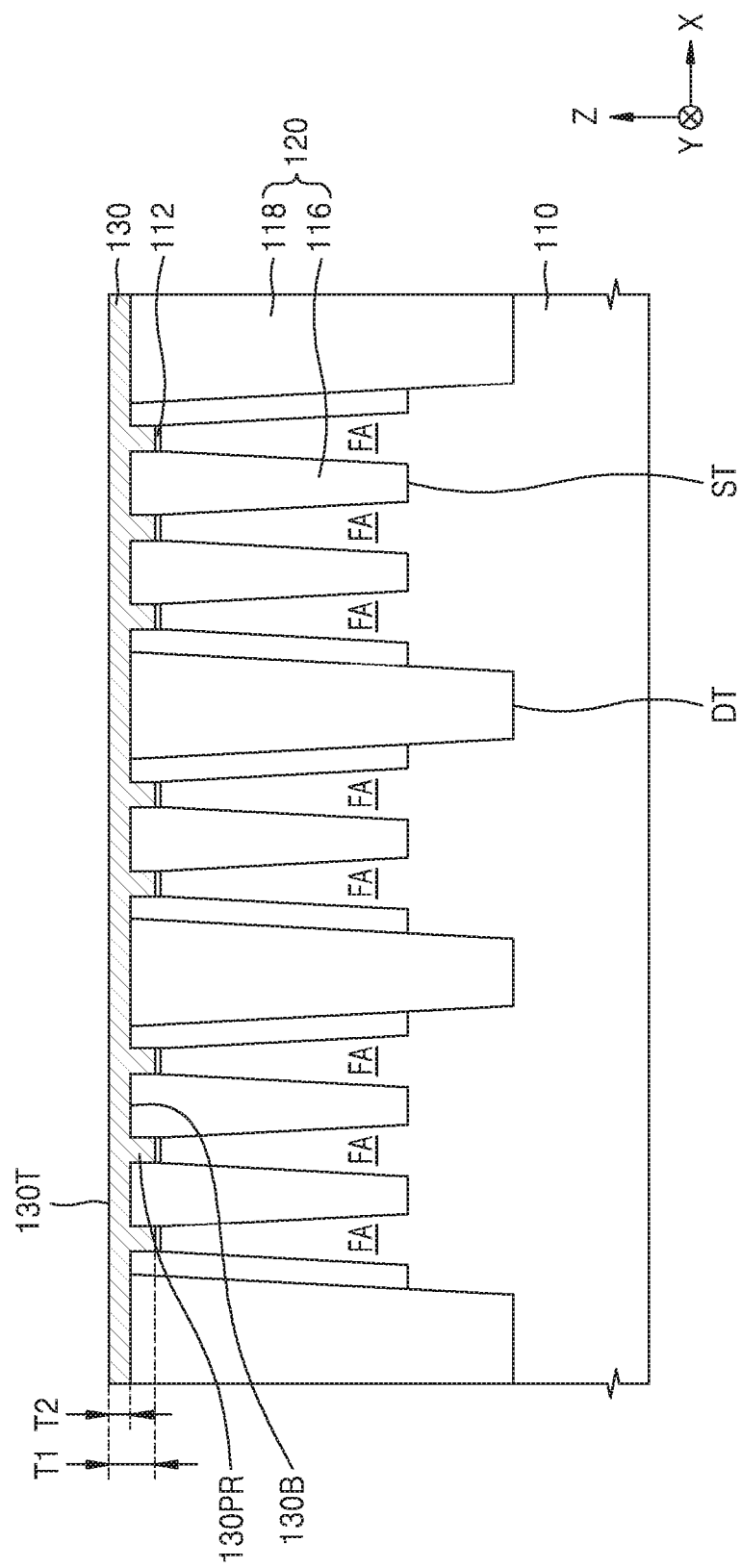

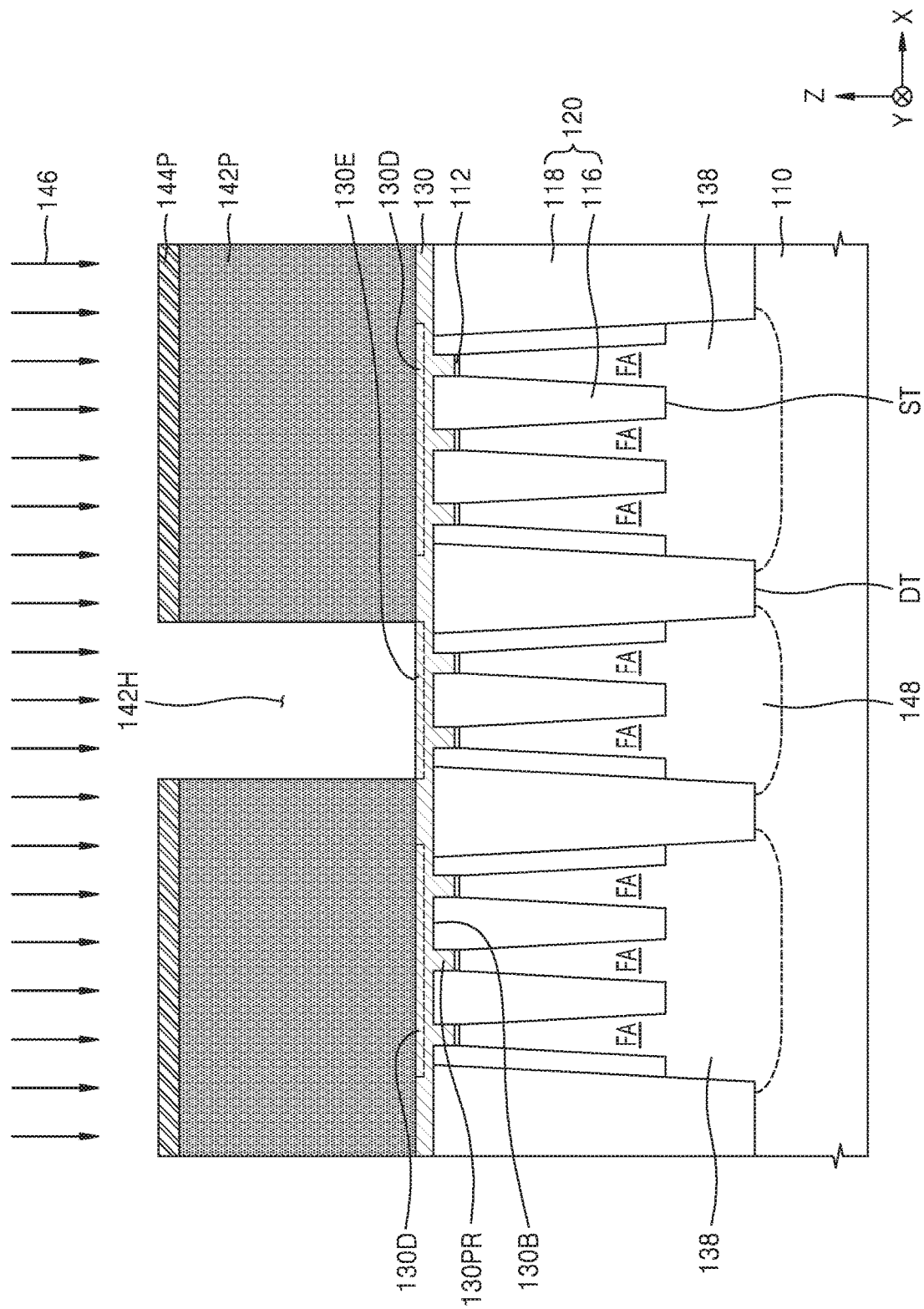

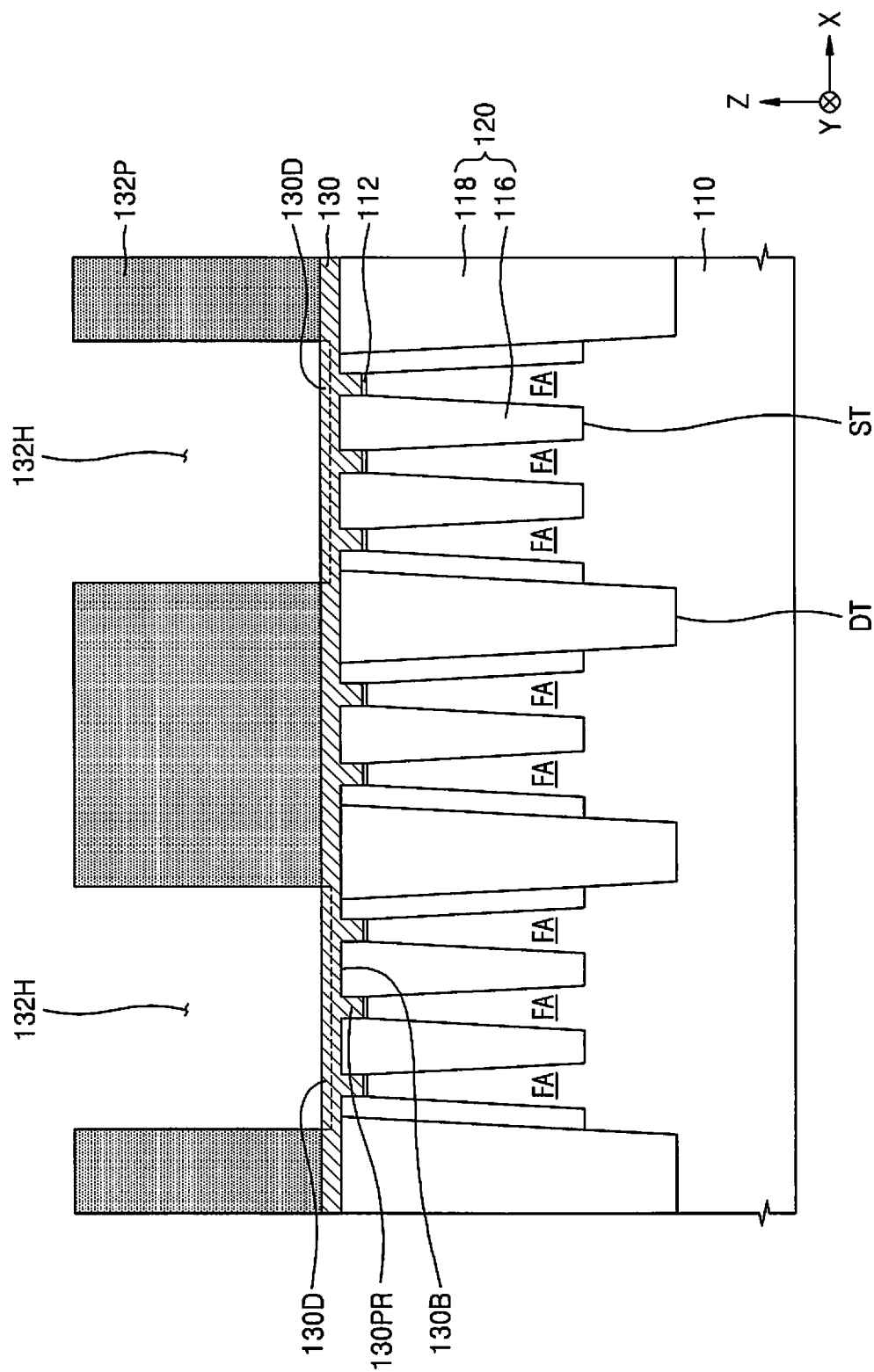

METHOD OF MANUFACTURING INTEGRATED CIRCUIT DEVICE

CROSS-REFERENCE TO RELATED APPLICATION

This application claims the benefit of Korean Patent Application No. 10-2017-0146792, filed on Nov. 6, 2017, in the Korean Intellectual Property Office, the disclosure of which is incorporated herein in its entirety by reference.

BACKGROUND

Inventive concepts relate to a method of manufacturing an integrated circuit device, and more particularly, to a method of manufacturing an integrated circuit device including patterns having a fine critical dimension (CD).

With the rapid development of down-scaling and large-scale integration of integrated circuit devices, new techniques for manufacturing integrated circuit devices with a reduced design rule are desired. For example, when only a photoresist pattern is used as a mask pattern during photolithography for realizing patterns having a fine CD, guaranteeing the dimensional accuracy of the patterns or devices to be formed may be difficult. When a mask pattern having multiple layers is used during photolithography, various etching processes for patterning the multiple layers are additionally used and lower structures may be damaged during the etching processes. As a result, manufacturing integrated circuit devices which have wanted dimensional accuracy and electrical characteristics may be difficult. Therefore, new processes for overcoming a resolution limit in photolithography and preventing, or reducing the likelihood of, lower patterns from being adversely affected during etching processes for patterning multiple layers are desired to be developed.

SUMMARY

Inventive concepts provides an integrated circuit device manufacturing method for more precisely controlling the dimensional accuracy of devices to be formed and securing desired electrical characteristics thereof by overcoming a resolution limit in photolithography for forming fine patterns, which have a fine critical dimension (CD) due to down-scaling of an integrated circuit device, and preventing lower patterns from being adversely affected during etching processes for patterning multiple layers.

According to some example embodiments of inventive concepts, there is provided a method of manufacturing an integrated circuit device. In the method, a plurality of fin-type active regions are formed in a substrate. A diffusion buffer layer is formed on the fin-type active regions to block oxygen from diffusing into the fin-type active regions. A carbon-containing layer is formed on the diffusion buffer layer. A carbon-containing mask pattern is formed to have an opening exposing a portion of the diffusion buffer layer by etching the carbon-containing layer using an etching gas including an oxygen atom. Impurity ions are implanted into a subset of the fin-type active regions through the opening and the diffusion buffer layer using the carbon-containing mask pattern as an ion-implantation mask.

According to some example embodiments of inventive concepts, there is provided a method of manufacturing an integrated circuit device. In the method, a diffusion buffer layer is formed on a substrate having a plurality of fin-type active regions. A first mask stack structure is formed on the diffusion buffer layer. A first mask pattern is formed to have a first opening exposing a first region of the diffusion buffer layer and to cover a second region of the diffusion buffer layer by etching the first mask stack structure. First impurity ions are implanted into a a subset of the fin-type active regions through the first opening and the first region of the diffusion buffer layer using the first mask pattern as an ion-implantation mask, the first group of fin-type active regions being selected from among the plurality of fin-type active regions. The second region of the diffusion buffer layer is exposed by removing the first mask pattern.

According to some example embodiments of inventive concepts, there is provided a method of manufacturing an integrated circuit device. In the method, a plurality of fin-type active regions are formed to extend in parallel with each other by partially etching a substrate. An insulating film is formed to fill spaces among the plurality of fin-type active regions. A diffusion buffer layer is formed on the plurality of fin-type active regions and the insulating film to block oxygen from diffusing into the fin-type active regions. A mask stack structure having multiple layers is formed on the diffusion buffer layer. A mask pattern is formed to have an opening exposing a portion of the diffusion buffer layer by etching the mask stack structure. A well is formed in a subset of the plurality of fin-type active regions by implanting impurity ions into the subset of the fin-type active regions through the opening and the diffusion buffer layer using the mask pattern as an ion-implantation mask.

BRIEF DESCRIPTION OF THE DRAWINGS

Embodiments of inventive concepts will be more clearly understood from the following detailed description taken in conjunction with the accompanying drawings in which:

FIGS. 2A through 2H are cross-sectional views of the stages in a method of manufacturing an integrated circuit device, according to some example embodiments of inventive concepts;

DETAILED DESCRIPTION OF EXAMPLE EMBODIMENTS

Figure 1A:
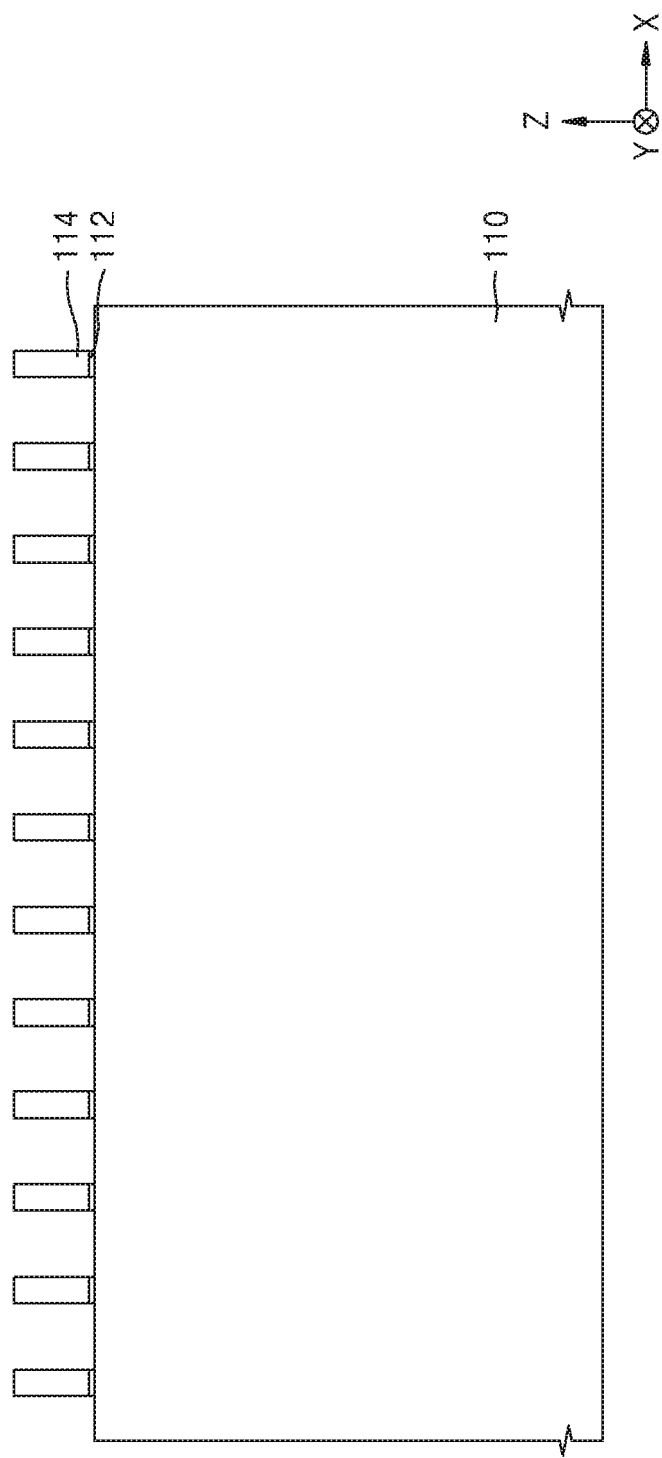
FIGS. 1A through 1T are cross-sectional views of the stages in a method of manufacturing an integrated circuit device, according to some embodiments of inventive concepts.
Figure 1B:
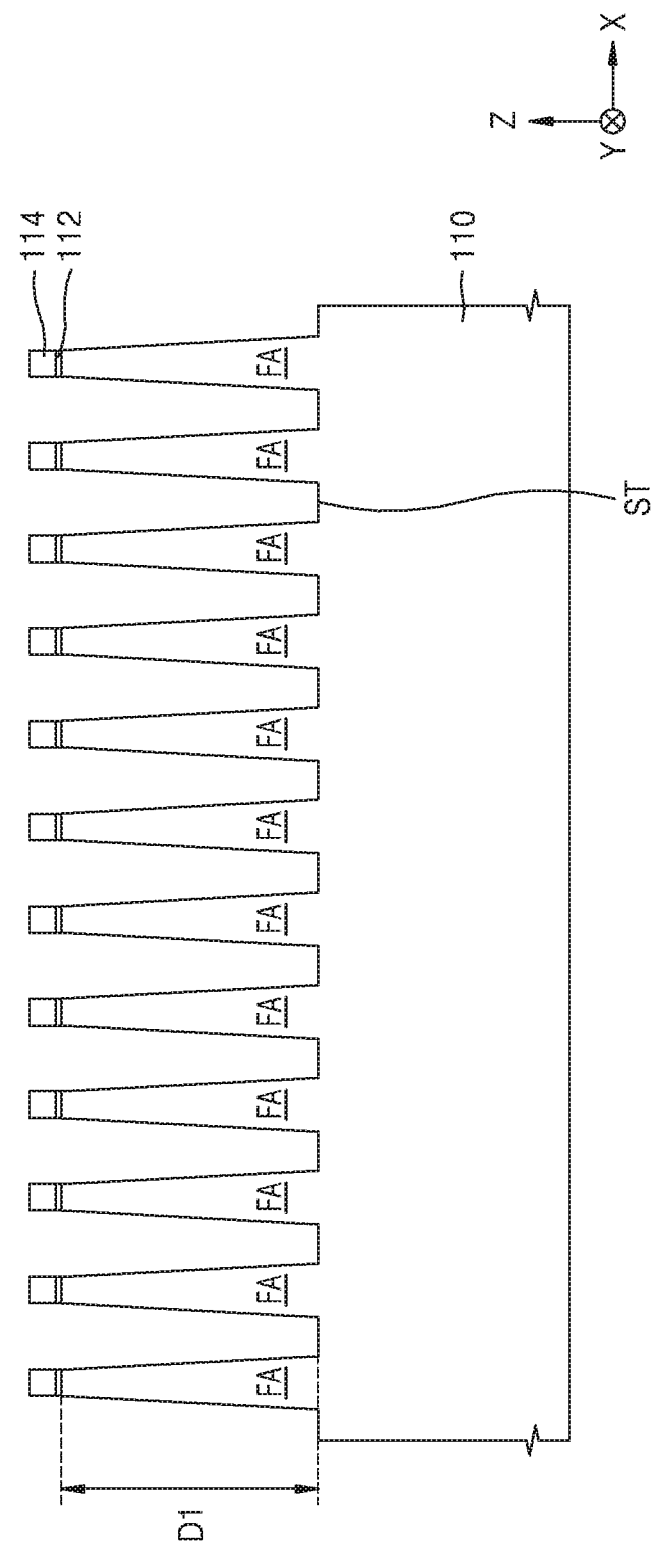
Figure 1C:
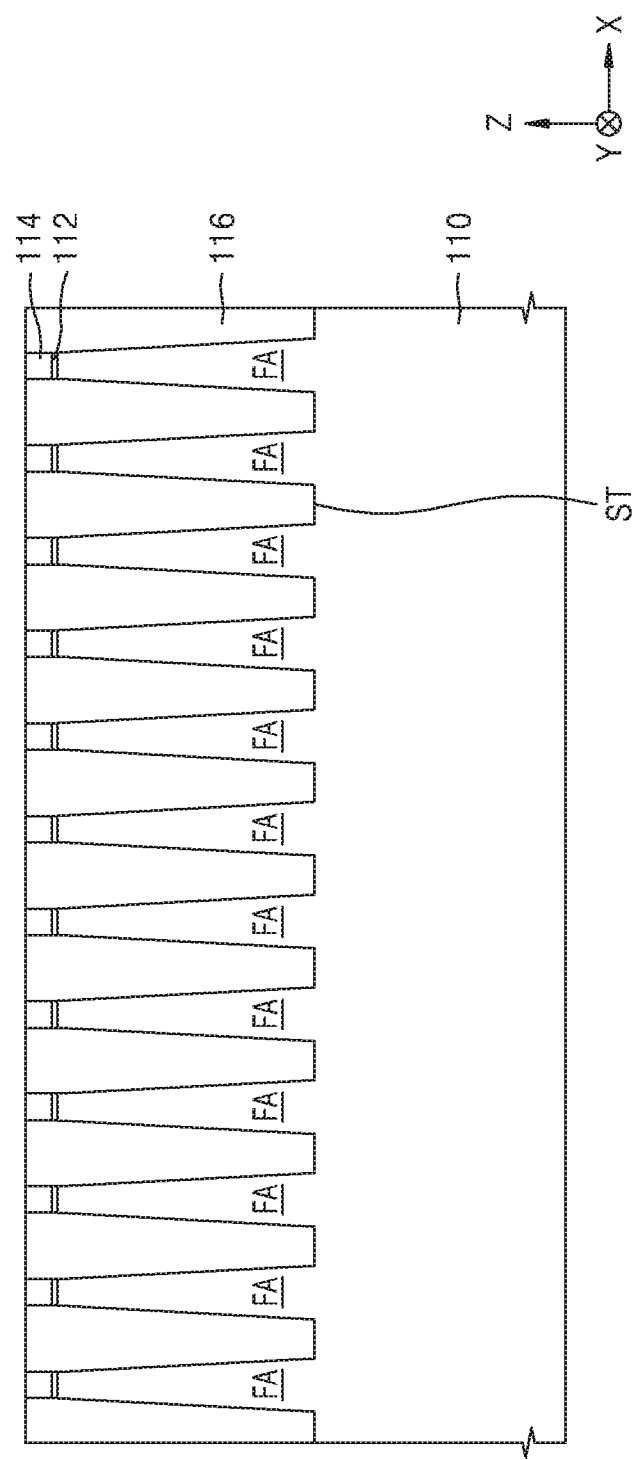
Figure 1D:
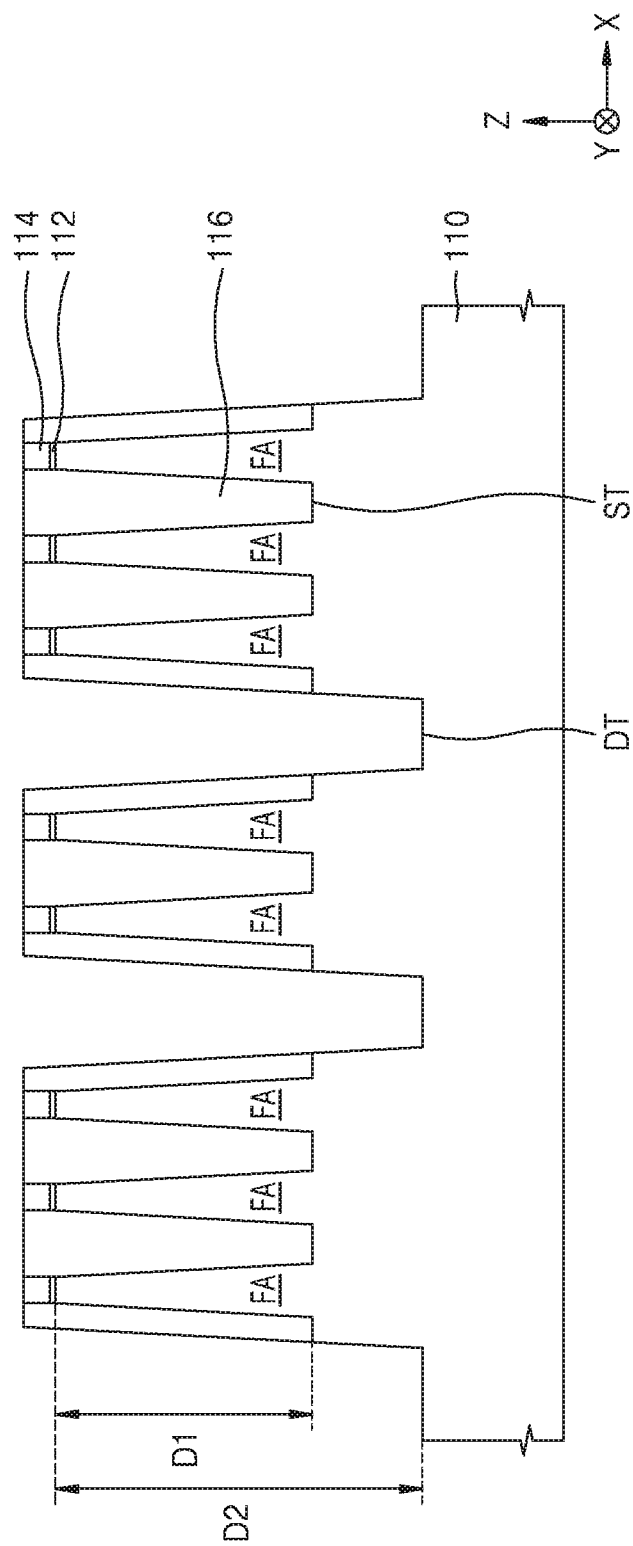
Figure 1E:
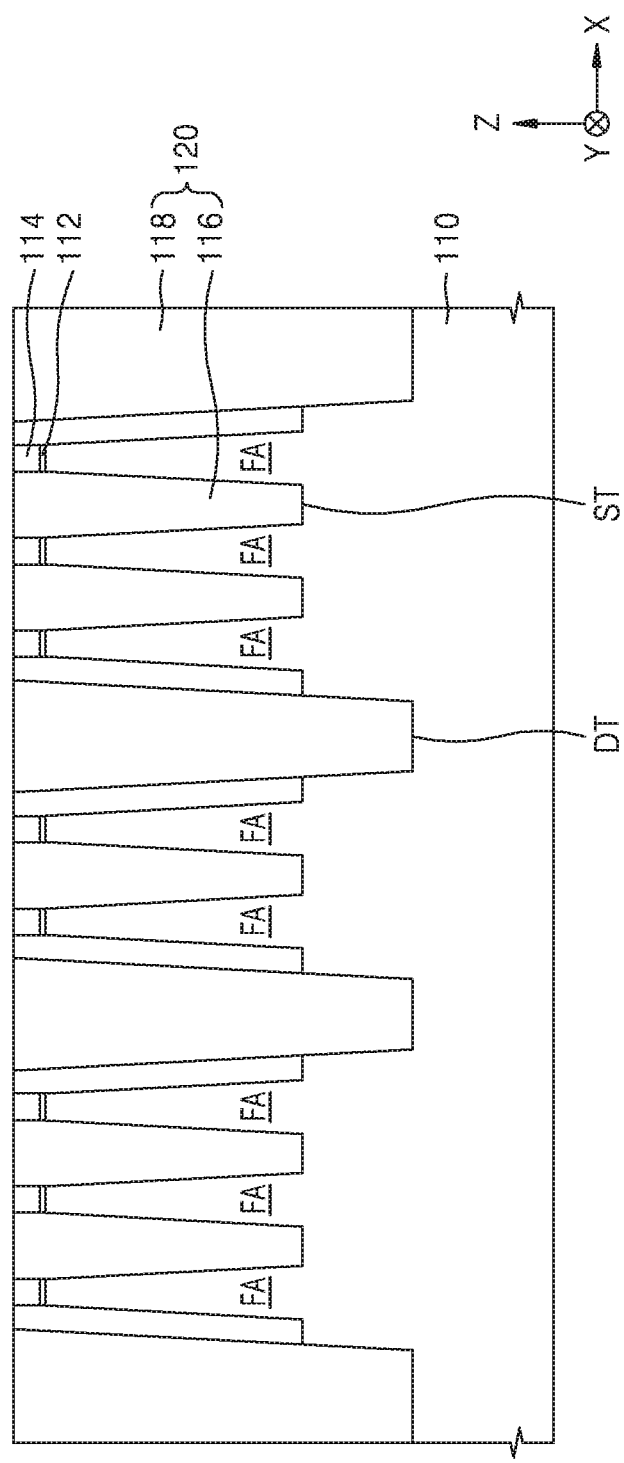
Figure 1H:
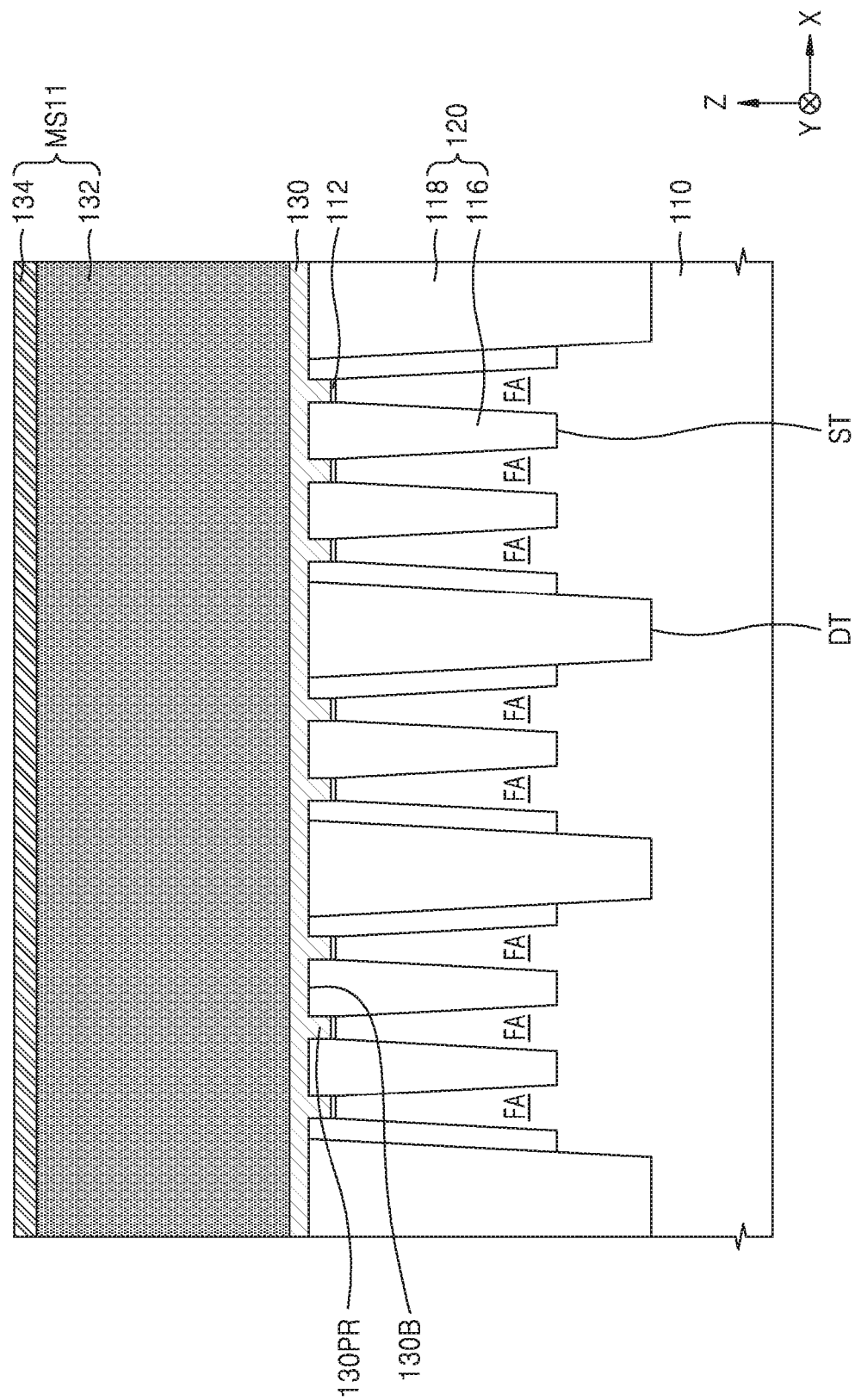
Figure 1I:
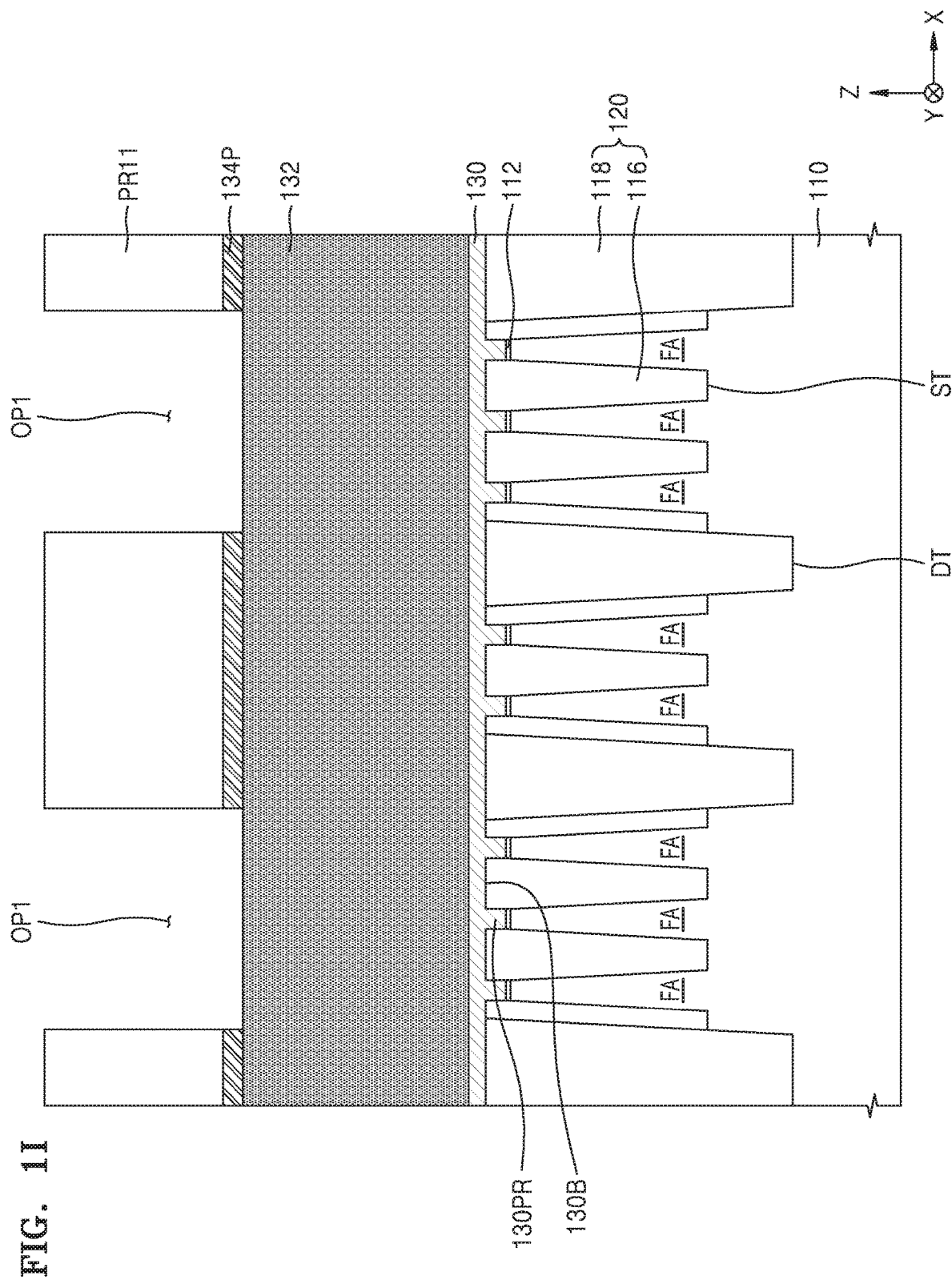
Figure 1J:
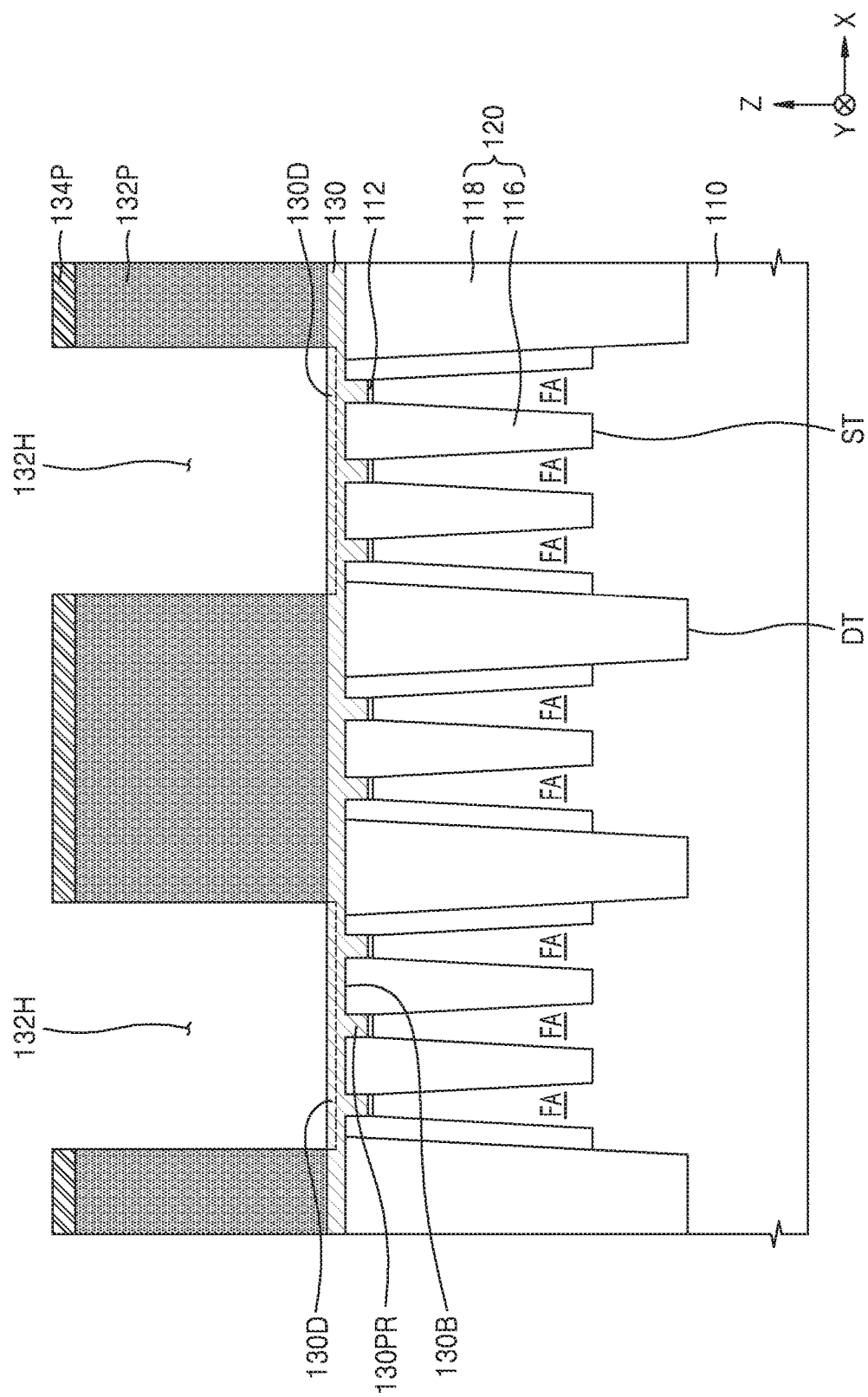
Figure 1K:
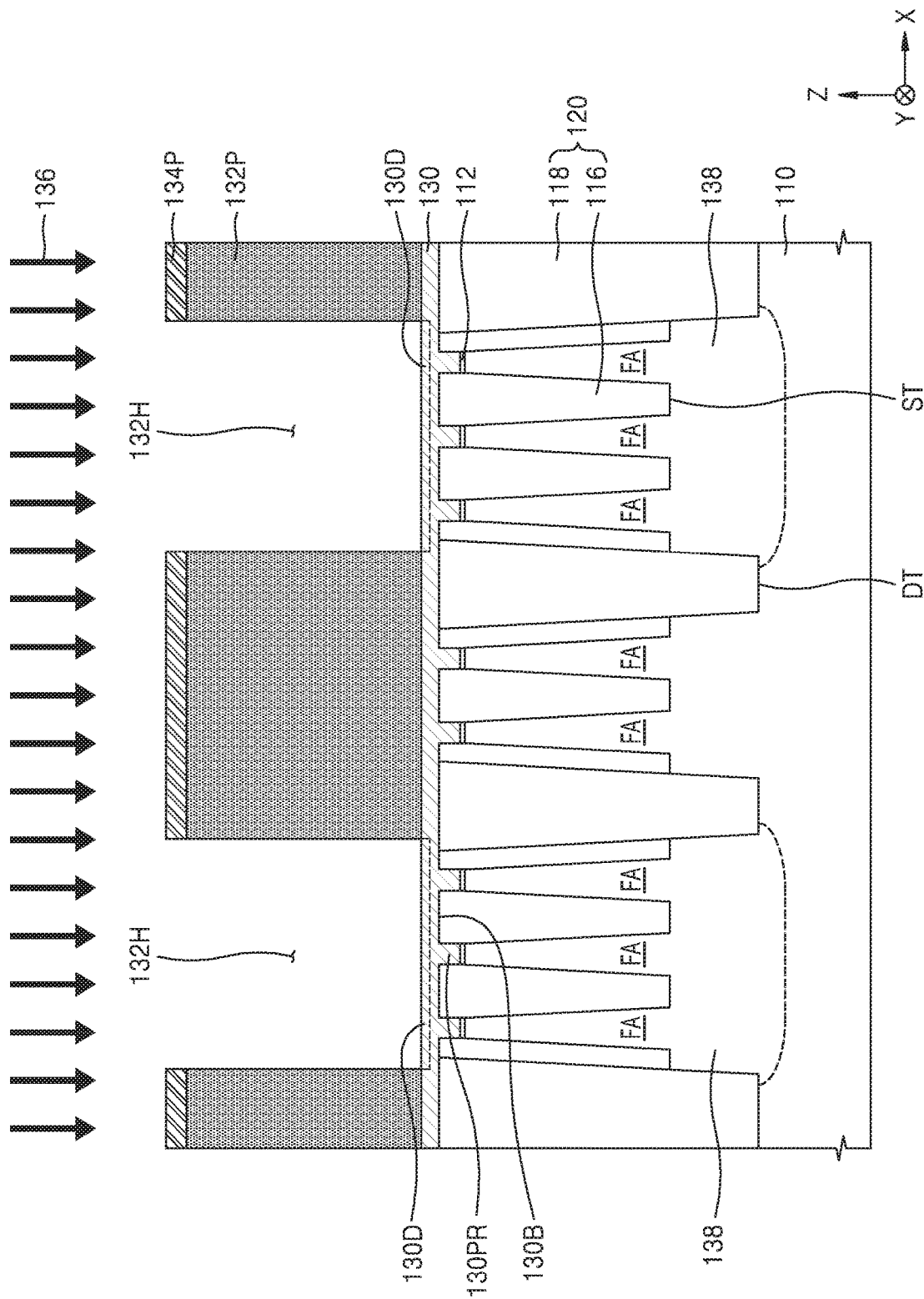
Figure 1L:
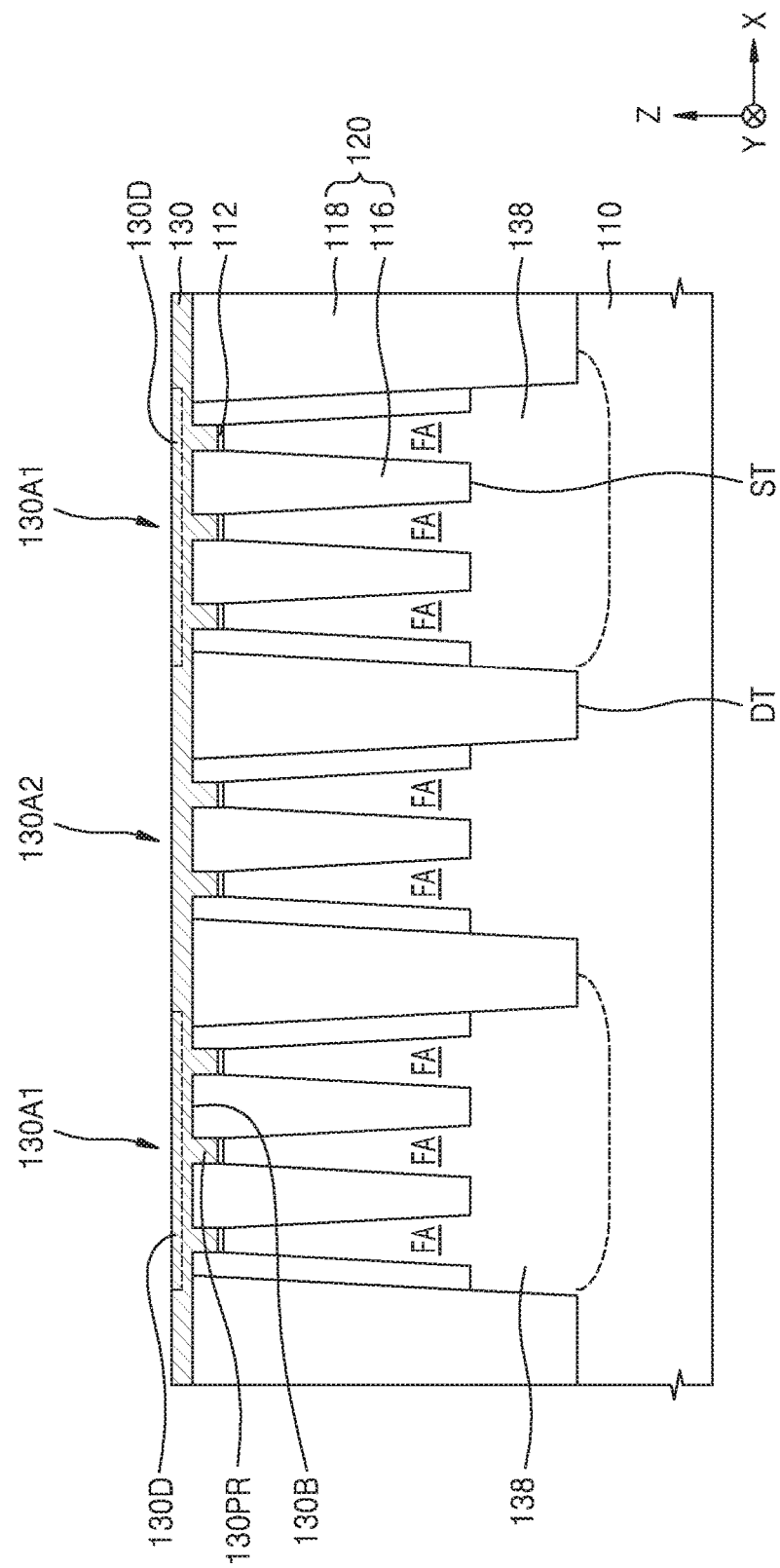
Figure 1M:
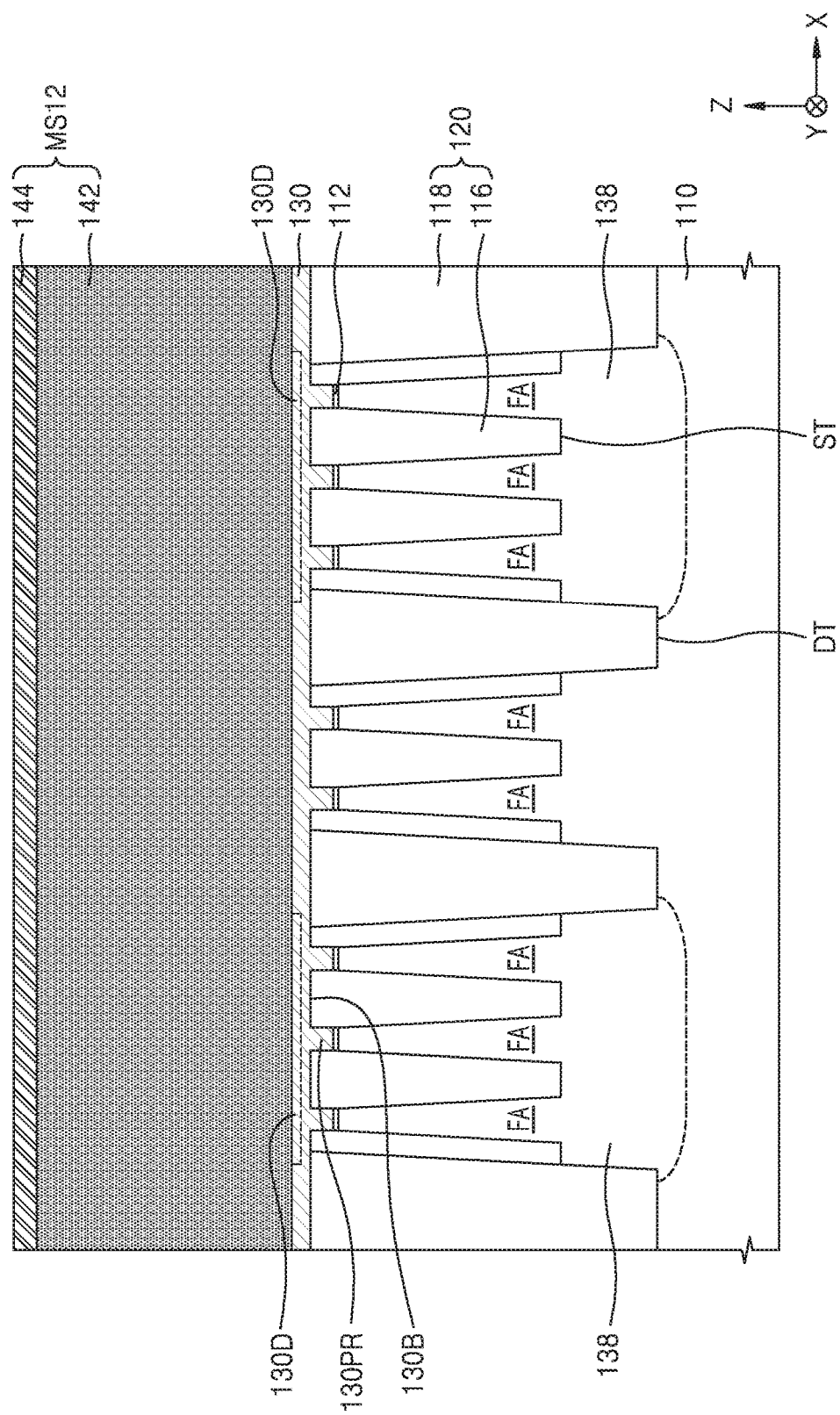
Figure 1N:
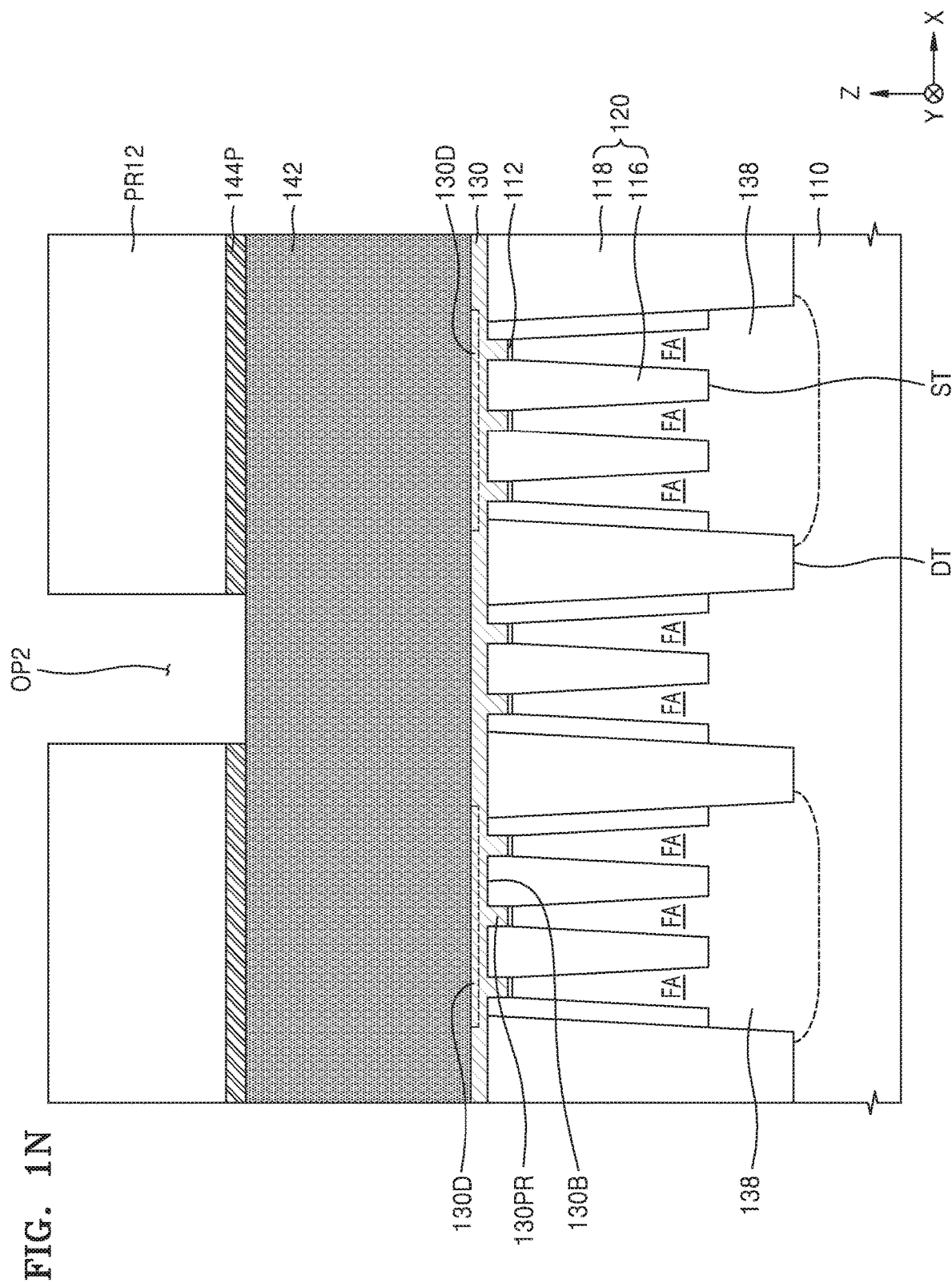
Figure 10:
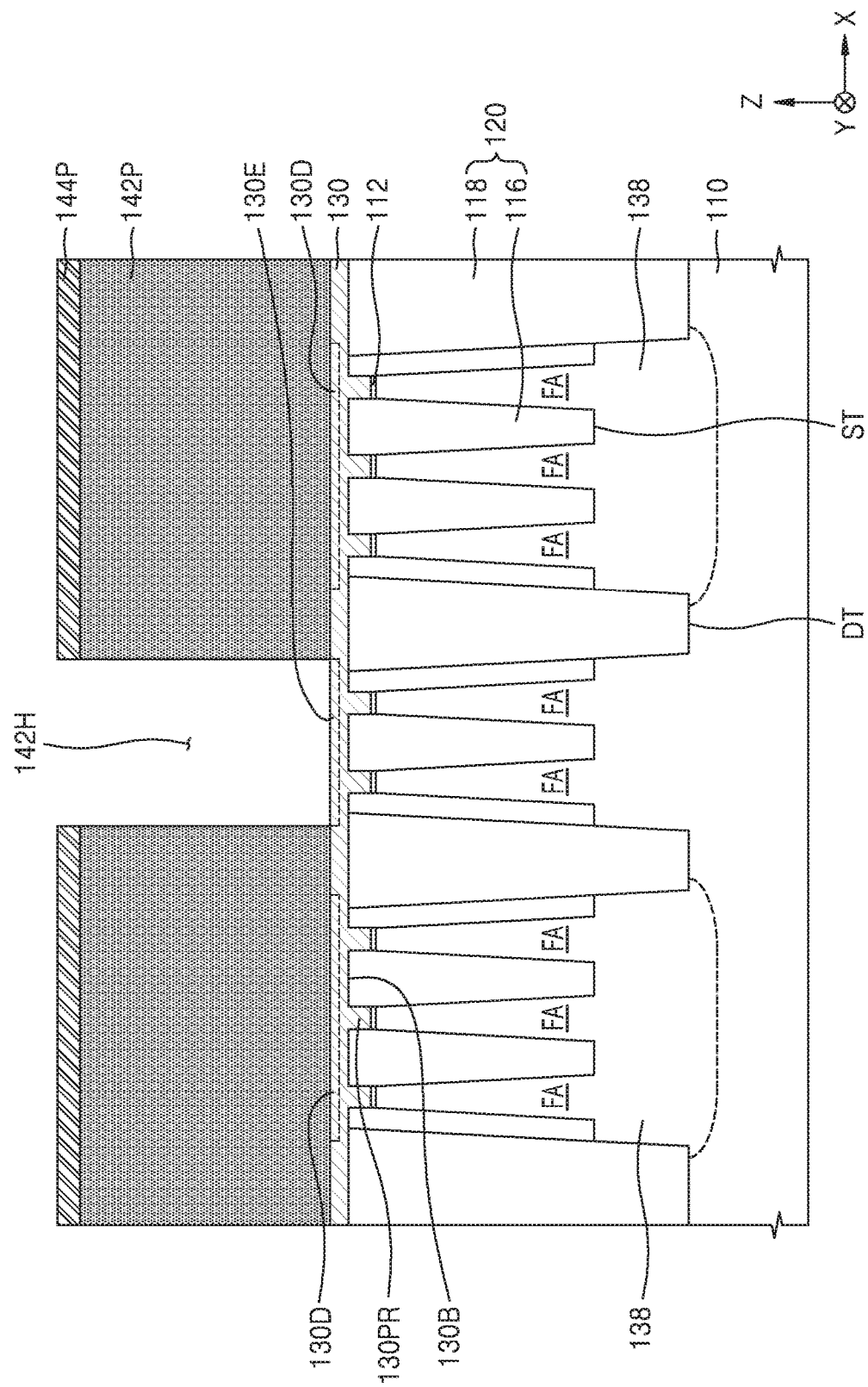
Figure 1Q:
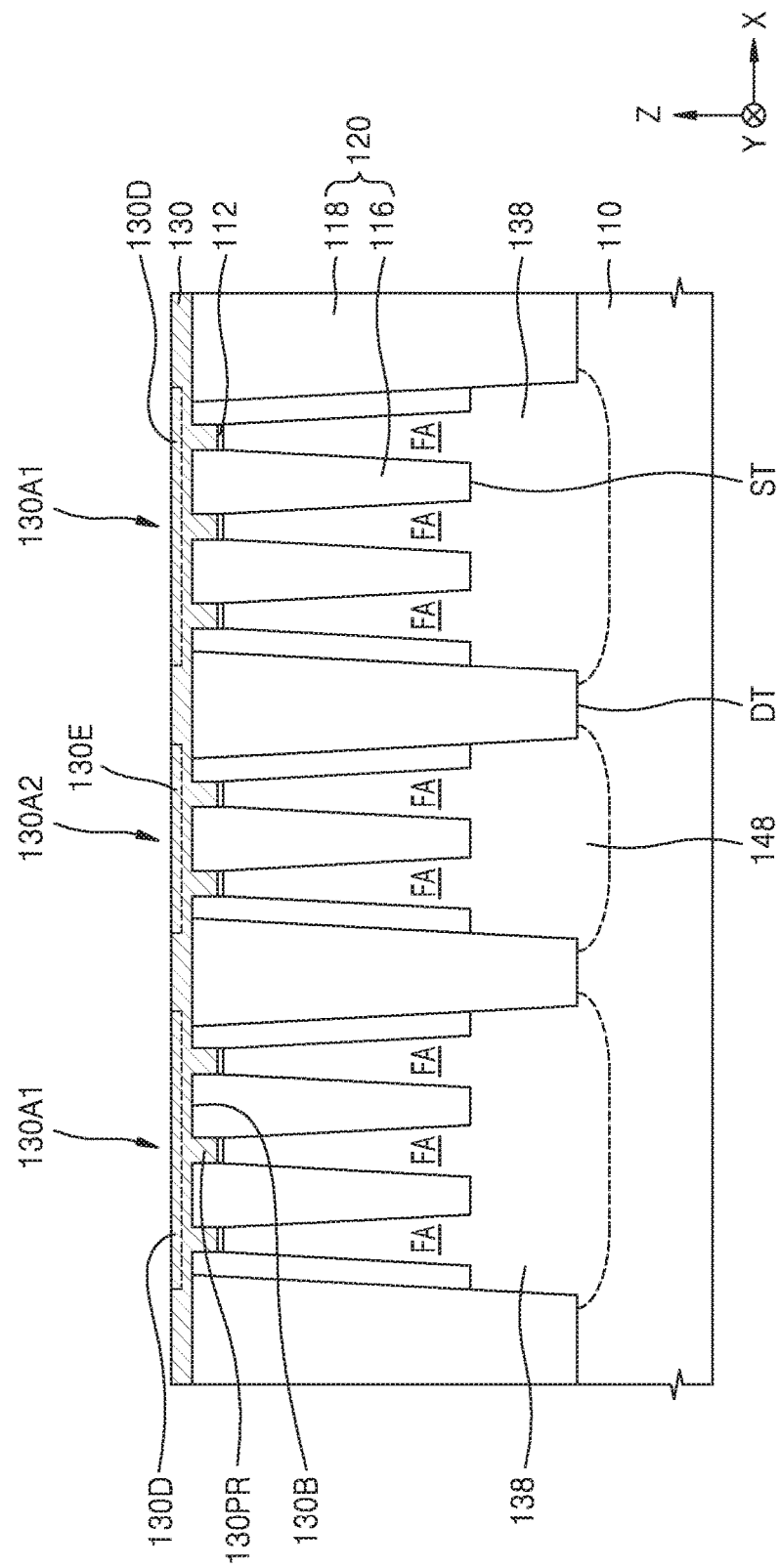
Figure 1R:
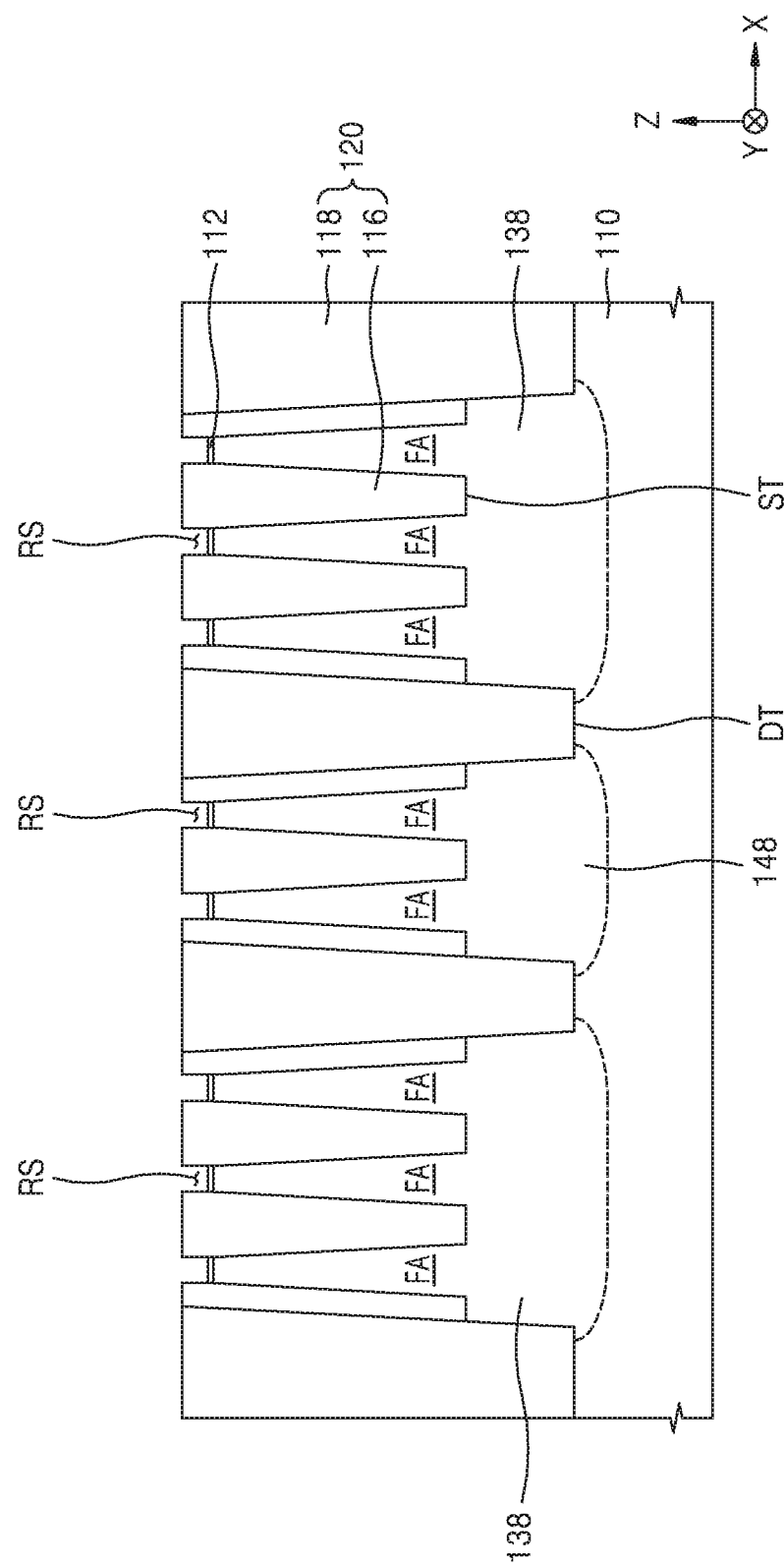
Figure 1S:
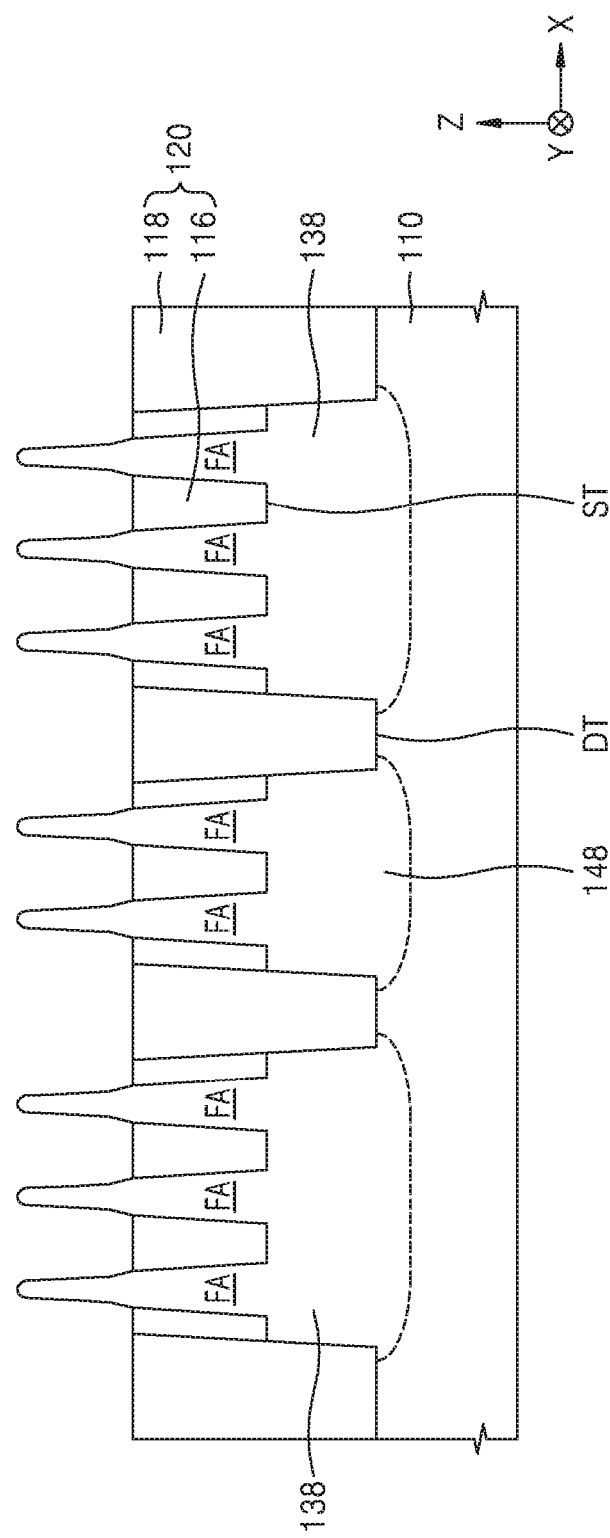
Figure 1T:
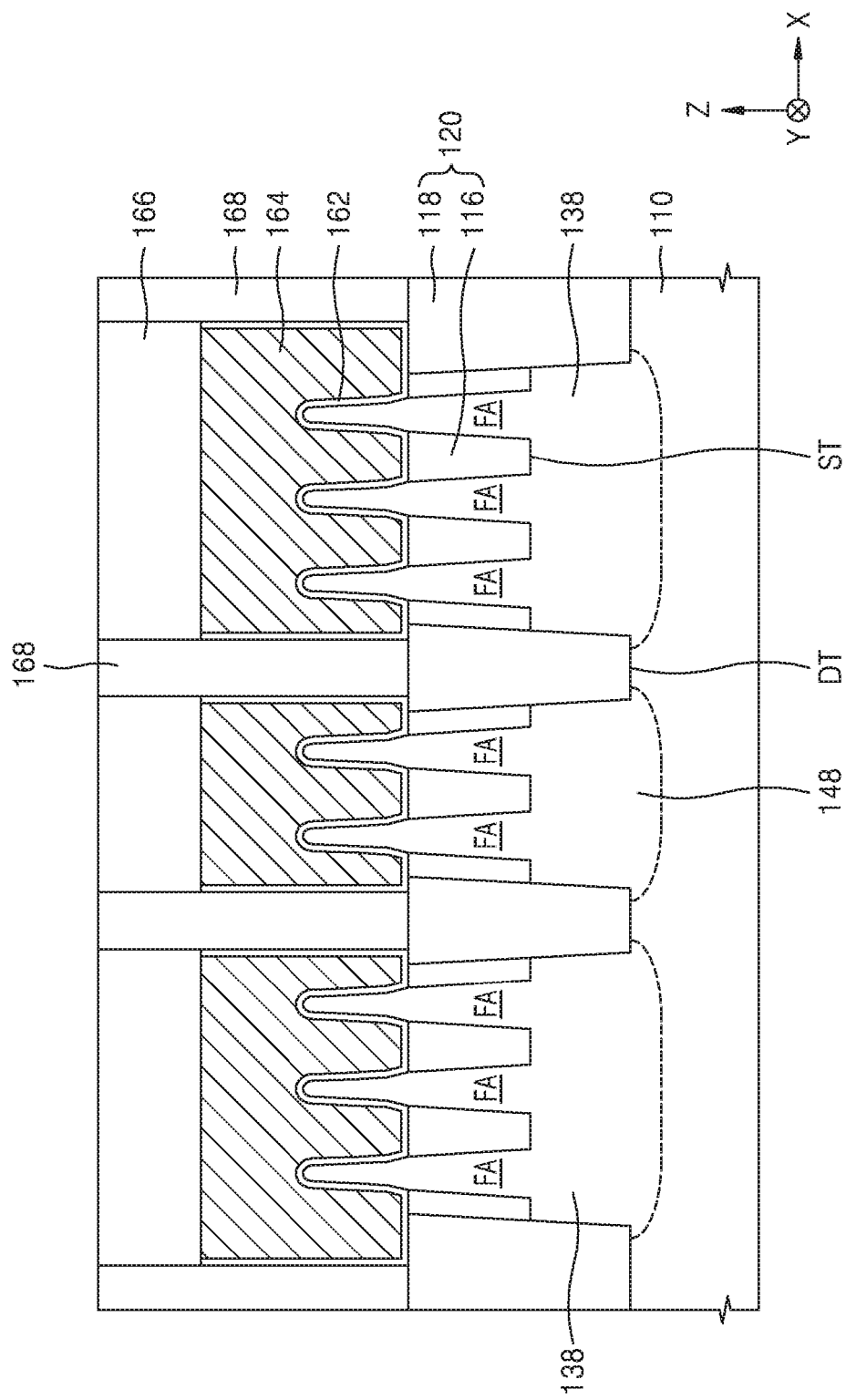

FIGS. 1A through 1T are cross-sectional views of the stages in a method of manufacturing an integrated circuit device, according to some embodiments of inventive concepts.

Referring to FIG. 1A, a plurality of pad oxide film patterns 112 and a plurality of mask patterns 114 are formed on a substrate 110.

The substrate 110 may be or may include a semiconductor substrate. In some embodiments, the substrate 110 may include a semiconductor such as Si or Ge. In some embodiments, the substrate 110 may include a compound semiconductor such as SiGe, SiC, GaAs, InAs, and/or InP.

The pad oxide film patterns 112 and the mask patterns 114 may extend in one direction (i.e., a Y direction) to be parallel with one another. In some embodiments, the pad oxide film patterns 112 may include an oxide film obtained by thermally oxidizing the surface of the substrate 110. The mask patterns 114 may include a silicon nitride film.

Referring to FIG. 1B, the substrate 110 is partially etched using the mask patterns 114 as etching masks to form a plurality of shallow trenches ST in the substrate 110. When the shallow trenches ST are formed, a plurality of fin-type active regions FA protruding upward from the substrate 110 in a vertical direction (e.g., a Z direction) and extending in one direction (e.g., a Y direction) may be obtained. The bottom surface of the shallow trenches ST may be at a level lower than the top surface of the fin-type active regions FA by a first depth D1.

Referring to FIG. 1C, a first isolation film 116 is formed in spaces among the fin-type active regions FA to fill the shallow trenches ST.

The first isolation film 116 may include an insulating film. In some embodiments, the first isolation film 116 may include an insulating liner, a stressor liner, and a burying insulating film, which sequentially cover opposite side walls of each of the fin-type active regions FA. The insulating liner may be obtained by oxidizing, e.g. thermally oxidizing, the surface of each fin-type active region FA. For example, the insulating liner may include a silicon oxide film formed using thermal oxidation. The insulating liner may have a thickness of about 10 Å (1 nm) to about 100 Å (10 nm). The stressor liner may be formed to have a uniform thickness to conformally cover the insulating liner. The stressor liner may be formed of SiN, SiON, SiBN, SiC, SiC:H, SiCN, SiCN:H, SiOCN, SiOCN:H, SiOC, $SiO_2$, polysilicon, or a combination thereof. The stressor liner may have a thickness of about 10 Å to about 100 Å. The stressor liner may be formed using plasma enhanced chemical vapor deposition (PECVD), high density plasma CVD (HDP CVD), inductively coupled plasma CVD (ICP CVD), and/or capacitor coupled plasma CVD (CCP CVD). The burying insulating film may be formed of fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ), but inventive concepts are not limited thereto. To form the burying insulating film, an oxide film filling the shallow trenches ST and covering the top surface of the mask patterns 114 may be formed and then annealed. Thereafter, the oxide film may be partially removed from the top thereof to expose the top surfaces of the mask patterns 114. The burying insulating film may be formed using flowable CVD (FCVD) and/or spin coating.

A planarized surface may be obtained due to the top surfaces of the mask patterns 114 and the top surface of the first isolation film 116. In some embodiments, the top surfaces of the mask patterns 114 and the top surface of the first isolation film 116 may extend on one plane.

Referring to FIG. 1D, some fin-type active regions FA and insulating films surrounding those fin-type active regions FA may be removed to form a plurality of deep trenches DT in the substrate 110.

The bottom surface of the deep trenches DT may be at a level lower than the top surface of the fin-type active regions FA by a second depth D2. The second depth D2 to the bottom surface of the deep trenches DT may be greater than the first depth D1 to the bottom surface of the shallow trenches ST. For example, the second depth D2 may be about 50 nm to about 150 nm greater than the first depth D1, but inventive concepts is not limited thereto.

In some embodiments, the substrate 110 may be divided into a plurality of device regions by the deep trenches DT. The device regions may be areas for which different threshold voltages are desired and/or tuned. For example, among the device regions, some device regions may be N-channel metal-oxide semiconductor (NMOS) transistor regions and other device regions may be P-channel MOS (PMOS) transistor regions. Some device regions may include NMOS transistors with a first target threshold voltage, some device regions may include NMOS transistors with a second target threshold voltage different from the first target threshold voltage, some device regions may include PMOS transistors with a third target threshold voltage, and some device regions may include PMOS transistors with a fourth target threshold voltage different from the third target threshold voltage. However, inventive concepts are not limited thereto.

To form the deep trenches DT, a photoresist pattern (not shown) partially exposing the top surface of the resultant structure shown in FIG. 1C may be formed on the resultant structure, and the exposed top surface of the resultant structure may be partially dry-etched using the photoresist pattern as an etch mask. Thereafter, the photoresist pattern may be removed. For example, the photoresist pattern may be removed with an oxygen plasma or ashing process; however, inventive concepts are not limited thereto.

Referring to FIG. 1E, a second isolation film 118 is formed to fill the deep trenches DT. The first isolation film 116 and the second isolation film 118 may be included in an isolation film 120.

Coating and/or deposition may be used to form the second isolation film 118. In some embodiments, the second isolation film 118 may be formed of USG, but inventive concepts are not limited thereto. A portion of the second isolation film 118 may directly contact the first isolation film 116.

In some embodiments, to form the second isolation film 118, an insulating film may be formed to fill the deep trenches DT and cover the top surfaces of the mask patterns 114, and then the top surface of the insulating film may be planarized to expose the top surface of the mask patterns 114. At this time, the mask patterns 114 and the first isolation film 116 may be partially consumed so that the heights of the mask patterns 114 and the first isolation film 116 may be partially lowered.

After the second isolation film 118 is formed, a planarized surface may be obtained due to the top surfaces of the mask patterns 114, the top surface of the first isolation film 116, and the top surface of the second isolation film 118. In some embodiments, the top surfaces of the mask patterns 114, the top surface of the first isolation film 116, and the top surface of the second isolation film 118 may extend on one plane.

Referring to FIG. 1F, the mask patterns 114 are removed from the resultant structure shown in FIG. 1E to expose the pad oxide film patterns 112.

After the mask patterns 114 are removed, a plurality of recesses RS having a width limited by the isolation film 120 may be respectively formed on the pad oxide film patterns 112. The recesses RS may have a line shape extending long in a length direction of the fin-type active regions FA, e.g., the Y direction.

Referring to FIG. 1G, a diffusion buffer layer 130 is formed on the pad oxide film patterns 112 and the isolation film 120.

The diffusion buffer layer 130 may be formed on the fin-type active regions FA to fill the recesses RS (see FIG. 1F) and cover the top surface of the isolation film 120. The fin-type active regions FA may be spaced apart from the diffusion buffer layer 130 with the pad oxide film patterns 112 respectively therebetween.

The diffusion buffer layer 130 may be formed to have a variable thickness according to a position on the substrate 110, e.g. a position relative to the fin-type active regions FA. As shown in FIG. 1G, a thickness T1 of portions of the diffusion buffer layer 130, which respectively cover the fin-type active regions FA, may be greater than a thickness T2 of portions of the diffusion buffer layer 130, which are between the fin-type active regions FA.

The diffusion buffer layer 130 has a flat top surface 130T and a bottom surface 130B having a ribbed shape due to a plurality of protrusions 130PR respectively filling the recesses RS in the current embodiments, but inventive concepts is not limited thereto. For example, the diffusion buffer layer 130 may conformally extend along the inner walls of the recesses RS and the top surface of the isolation film 120 to have a uniform thickness on the substrate 110.

The diffusion buffer layer 130 may be formed of silicon oxide, silicon nitride, silicon oxynitride, silicon carbonitride, silicon carbide, silicon oxycarbide, silicon oxycarbonitride, polysilicon, or a combination thereof. In some embodiments, the diffusion buffer layer 130 may be formed of $SiO_2$, $Si_3N_4$, SiON, SiC, SiC:H, SiCN, SiCN:H, SiOCN, SiOCN:H, SiOC, polysilicon, or a combination thereof. The diffusion buffer layer 130 may have a thickness of about 50 Å (5 nm) to about 300 Å (30 nm). In some embodiments, relatively thinner portions of the diffusion buffer layer 130 covering the isolation film 120 may have a thickness of about 70 Å (7 nm) to about 150 Å (15 nm). For example, relatively thinner portions of the diffusion buffer layer 130 covering the isolation film 120 may have a thickness of about 100 Å. Relatively thicker portions of the diffusion buffer layer 130 covering the fin-type active regions FA may have a thickness of about 150 Å (15 nm) to about 300 Å (30 nm). However, the thickness of the diffusion buffer layer 130 is not limited to the values above and may vary within the scope of the technical spirit of inventive concepts. In some embodiments, atomic layer deposition (ALD) or CVD may be used to form the diffusion buffer layer 130.

Referring to FIG. 1H, a first mask stack structure MS11 including multiple layers is formed on the diffusion buffer layer 130.

The first mask stack structure MS11 may include a carbon-containing layer 132 and a silicon-containing organic anti-reflective layer 134, which sequentially cover the diffusion buffer layer 130.

The carbon-containing layer 132 may include a spin-on hardmask (SOH) layer and/or an amorphous carbon layer (ACL). The SOH layer may be formed of an organic compound having a relatively high carbon content of about 85 wt % to about 99 wt % based on the total weight of the SOH layer. The organic compound may include a hydrocarbon compound including an aromatic ring, such as phenyl, benzene, or naphthalene, or a derivative thereof.

Spin coating or CVD may be used to form the carbon-containing layer 132. In some embodiments, an organic compound layer may be formed on the diffusion buffer layer 130 using spin coating to form the carbon-containing layer 132. The organic compound layer may include a hydrocarbon compound including an aromatic ring, such as phenyl, benzene, or naphthalene, or a derivative thereof. The organic compound layer may have a relatively high carbon content of about 85 wt % to about 99 wt % based on the total weight of the organic compound layer. The organic compound layer may be primarily baked at a temperature of about 150° C. to 350° C. for about 60 seconds, then secondarily baked at a temperature of about 300° C. to 550° C. for about 30 to 300 seconds, and then cured to obtain the carbon-containing layer 132. The carbon-containing layer 132 may be formed to have a thickness of about 4000 Å (400 nm) to about 8000 Å (800 nm).

The silicon-containing organic anti-reflective layer 134 may be formed of a crosslinked polymer having a silicon content of about 10 wt % to 50 wt %. In some embodiments, the silicon-containing organic anti-reflective layer 134 may be obtained from a product available on the market (e.g., Sepr-Shb Aseries SiARC marketed by Shin Etsu Chemical Co., Ltd.). The silicon-containing organic anti-reflective layer 134 may be formed to have a thickness of about 500 Å (50 nm) to about 1000 Å (100 nm). In some embodiments, the thickness of the carbon-containing layer 132 may be about five to ten times greater than the thickness of the silicon-containing organic anti-reflective layer 134 in the first mask stack structure MS11.

Referring to FIG. 1I, a photoresist pattern PR11 is formed on the first mask stack structure MS11 (see FIG. 1H), and the silicon-containing organic anti-reflective layer 134 is etched using the photoresist pattern PR11 as an etch mask to form a silicon-containing organic anti-reflective pattern 134P.

The photoresist pattern PR11 may have an opening OP1 which exposes the carbon-containing layer 132 in a certain type of a device region among a plurality of device regions of the substrate 110. In some embodiments, a portion of the carbon-containing layer 132 covering an NMOS transistor region of the substrate 110 may be exposed through the opening OP1 of the photoresist pattern PR11. In some embodiments, a portion of the carbon-containing layer 132 covering a PMOS transistor region of the substrate 110 may be exposed through the opening OP1 of the photoresist pattern PR11.

The photoresist pattern PR11 may be formed of positive photoresist. For example, the photoresist pattern PR11 may be formed of resin including an acid-labile group and chemically amplified photoresist including a photo-acid generator (PAG). An exposure wavelength of an i-line (365 nm), a KrF excimer laser (248 nm), an ArF excimer laser (193 nm), an $F_2$ excimer laser (157 nm), or extreme ultra-violet (EUV) (13.5 nm) may be used in an exposure process for forming the photoresist pattern PR11. In some embodiments, when an exposure wavelength of 193 nm is used, immersion lithography may be used. However, inventive concepts are not limited thereto.

To form the silicon-containing organic anti-reflective pattern 134P, the silicon-containing organic anti-reflective layer 134 may be plasma-etched using a process gas including a $C_xF_yH_z$-containing gas (where "x" and "y" are integers of 1 to 10 and "z" is an integer of 0 to 10). The $C_xF_yH_z$-containing gas may be a gas containing carbon (C) and fluorine (F) or a gas containing C, F, and hydrogen (H). For example, the $C_xF_yH_z$-containing gas may be formed of $CF_4$, $C_3F_6$, $C_4F_6$, $C_4F_8$, $C_5F_8$, $CHF_3$, $CH_2F_2$, or a combination thereof. In some embodiments, the process gas may further include an inert gas such as argon (Ar).

Referring to FIG. 1J, the carbon-containing layer 132 is etched using the silicon-containing organic anti-reflective pattern 134P as an etch mask to form a carbon-containing mask pattern 132P having an opening 132H exposing the top surface of a portion of the diffusion buffer layer 130.

To form the carbon-containing mask pattern 132P, the carbon-containing layer 132 may be plasma-etched using an etching gas including a sulfur-containing gas. The sulfur-containing gas may include a sulfur atom (S) and an oxygen atom (0). In some embodiments, an etching gas for plasma etching the carbon-containing layer 132 may include COS, $SO_2$, or a combination thereof. For example, the etching gas for plasma etching the carbon-containing layer 132 may include COS. In some embodiments, the etching gas for plasma etching the carbon-containing layer 132 may further include at least one element among $O_2$, $CO_2$, $H_2$, and an inert gas such as argon. For example, the etching gas for plasma etching the carbon-containing layer 132 may include COS gas and $O_2$ gas.

In some embodiments, the etching gas for plasma etching the carbon-containing layer 132 may include about 35 to 50 volume percent of a sulfur-containing gas based on the total weight of the etching gas. For example, when the etching gas for plasma etching the carbon-containing layer 132 includes the sulfur-containing gas and $O_2$ gas, the $O_2$ gas may be supplied at a flow rate equal to or greater than that of the sulfur-containing gas during plasma etching of the carbon-containing layer 132. When the etching gas for plasma etching the carbon-containing layer 132 includes COS gas and $O_2$ gas, the ratio of a flow rate of the COS gas to a flow rate of the 02 gas may be about 1:1 to about 1:2. For example, the carbon-containing layer 132 may be plasma-etched using an etching gas including COS gas supplied at a flow rate of about 120 sccm and $O_2$ gas supplied at a flow rate of about 180 sccm.

While the carbon-containing mask pattern 132P is being formed by plasma etching the carbon-containing layer 132, oxygen atoms from the etching gas or by-products including oxygen atoms may be diffused into other films exposed to an etching atmosphere of the carbon-containing layer 132.

In some embodiments, during the formation of the carbon-containing mask pattern 132P, a plurality of first oxygen diffusion regions 130D spaced apart from the bottom surface 130B of the diffusion buffer layer 130 may be respectively formed in portions of the diffusion buffer layer 130 exposed through openings 132H, respectively.

In a comparative example, when the diffusion buffer layer 130 is omitted, oxygen atoms or by-products including oxygen atoms included in the etching atmosphere of the carbon-containing layer 132 may be diffused into top portions of the respective fin-type active regions FA during the plasma etching of the carbon-containing layer 132. As a result, the surface of the top portions of the fin-type active regions FA may be oxidized. When this oxidation occurs, the width of the top portion of each fin-type active region FA and the height of each fin-type active region FA may be decreased through subsequent etching and/or cleaning processes, and there may be undesirable width and/or height variation of the fin-type active regions FA on the substrate 110.

However, according to embodiments of inventive concepts, the carbon-containing layer 132 is formed on the diffusion buffer layer 130 covering the fin-type active regions FA, and therefore, the fin-type active regions FA are protected by the diffusion buffer layer 130 during the plasma etching of the carbon-containing layer 132. Accordingly, even if oxygen atoms from the etching gas or by-products including oxygen atoms are diffused into films exposed to the etching gas while the carbon-containing mask pattern 132P is being formed by plasma etching the carbon-containing layer 132, the oxygen atoms or the by-products including oxygen atoms may be prevented, or reduced in likelihood of from diffusing into the fin-type active regions FA using the diffusion buffer layer 130. Therefore, even though etching of the carbon-containing layer 132 is performed in an etching atmosphere including oxygen atoms to form the carbon-containing mask pattern 132P, an adverse effect which the etching atmosphere may have on the fin-type active regions FA is prevented, or reduced in likelihood, by the diffusion buffer layer 130, so that the fin-type active regions FA may be prevented, or reduced in likelihood, from being undesirably oxidized or damaged by the etching atmosphere, thereby having a stable profile.

In some embodiments, the carbon-containing mask pattern 132P may have a width of at least 100 nm in a horizontal direction, e.g., an X direction. In some embodiments, a ratio of a horizontal direction width to a vertical direction (i.e., Z direction) height, i.e., an aspect ratio, of the carbon-containing mask pattern 132P may be at least 3, for example, about 4 to 10, but is not limited thereto.

In some embodiments, the photoresist pattern PR11 (see FIG. 1I) on the silicon-containing organic anti-reflective pattern 134P may be consumed and removed during the etching of the carbon-containing layer 132. In some embodiments, after the carbon-containing mask pattern 132P is formed, the photoresist pattern PR11 may be removed to expose the top surface of the silicon-containing organic anti-reflective pattern 134P. In some embodiments, after the silicon-containing organic anti-reflective pattern 134P is formed as described with reference to FIG. 1I, the photoresist pattern PR11 may be removed from the silicon-containing organic anti-reflective pattern 134P, and the carbon-containing layer 132 may be etched using the silicon-containing organic anti-reflective pattern 134P as an etch mask, as described with reference to FIG. 1J.

Referring to FIG. 1K, impurity ions 136 are implanted into a first group, or first subset, of fin-type active regions FA, which are selected from among the plurality of the fin-type active regions FA, and the substrate 110 therebelow through the openings 132H of the carbon-containing mask pattern 132P and the diffusion buffer layer 130 to form a plurality of first wells 138. Each of the first wells 138 may include an impurity region doped with the impurity ions 136.

The impurity ions 136 may be n-type dopant or p-type dopant. When the substrate 110 is formed of a Group IV semiconductor, e.g., Si, n-type dopant may include a Group V element such as phosphorous (P), arsenic (As), or antimony (Sb), and p-type dopant may include a Group III element such as boron (B) or indium (In). However, inventive concepts is not limited thereto and the impurity ions 136 may vary with the material of the substrate 110. Further, a species implanted may be or include a molecule that contains a group V or group III element. For example, a p-type dopant may be or may include boron trifluoride ($BF_3$) or diborane ($B_2H_6$). However, inventive concepts are not limited thereto.

In some embodiments, each of the first wells 138 may provide an active region for an NMOS transistor region. In this case, the impurity ions 136 may be p-type dopant, and each of the first wells 138 may be a p-type well doped with p-type dopant. In some embodiments, each of the first wells 138 may provide an active region for a PMOS transistor region. In this case, the impurity ions 136 may be n-type dopant, and each of the first wells 138 may be an n-type well doped with n-type dopant. An energy of the implantation may be slightly higher than in a comparative example. For example, the energy may be higher to implant through the diffusion buffer layer 130. However, inventive concepts are not limited thereto.

Referring to FIG. 1L, the silicon-containing organic anti-reflective pattern 134P and the carbon-containing mask pattern 132P are removed from the resultant structure shown in FIG. 1K.

In some embodiments, wet etch may be performed using a first etchant including a mixture of $H_2SO_4$, $H_2O_2$, and deionized water (DIW) to remove the silicon-containing organic anti-reflective pattern 134P. In some embodiments, $H_2SO_4$ (purity 98%) and $H_2O_2$ (purity 40%) may be included in the first etchant at a volume ratio of about 4:1, but inventive concepts is not limited thereto.

In some embodiments, wet etch may be performed using a second etchant including a mixture of $NH_4OH$, $H_2O_2$, and DIW to remove the carbon-containing mask pattern 132P. $NH_4OH$ (purity 28%), $H_2O_2$ (purity 30%), and DIW may be included in the second etchant at a volume ratio of about 1:1:5, but inventive concepts is not limited thereto.

After the silicon-containing organic anti-reflective pattern 134P and the carbon-containing mask pattern 132P are removed, the top surfaces of the portions of the diffusion buffer layer 130, which have been covered with the carbon-containing mask pattern 132P, may be re-exposed. The diffusion buffer layer 130 exposed after the silicon-containing organic anti-reflective pattern 134P and the carbon-containing mask pattern 132P are removed may include a plurality of first regions 130A1, which respectively include the first oxygen diffusion regions 130D, and a plurality of second regions 130A2 not including the first oxygen diffusion regions 130D.

Referring to FIG. 1M, a second mask stack structure MS12 including a plurality of layers is formed on the diffusion buffer layer 130 having the first oxygen diffusion regions 130D formed therein.

The second mask stack structure MS12 may include a carbon-containing layer 142 and a silicon-containing organic anti-reflective layer 144, which sequentially cover the diffusion buffer layer 130.

The detailed composition of the carbon-containing layer 142 and the silicon-containing organic anti-reflective layer 144 are substantially the same as that of the carbon-containing layer 132 and the silicon-containing organic anti-reflective layer 134 which have been described with reference to FIG. 1H. The details of a method of forming the carbon-containing layer 132 and the silicon-containing organic anti-reflective layer 134 described above with reference to FIG. 1H will be referred to for a method of forming the carbon-containing layer 142 and the silicon-containing organic anti-reflective layer 144.

The carbon-containing layer 142 may be formed right on the diffusion buffer layer 130 to contact the top surface of the diffusion buffer layer 130.

Referring to FIG. 1N, a photoresist pattern PR12 is formed on the second mask stack structure MS12 (see FIG. 1M), and the silicon-containing organic anti-reflective layer 144 is etched using the photoresist pattern PR12 as an etch mask to form a silicon-containing organic anti-reflective pattern 144P.

The photoresist pattern PR12 may have an opening OP2. In some embodiments, when each of the first wells 138 formed in the substrate 110 provides an active region for an NMOS transistor region, a portion of the carbon-containing layer 142 covering a PMOS transistor region of the substrate 110 may be exposed through the opening OP2. In some embodiments, when each of the first wells 138 formed in the substrate 110 provides an active region for a PMOS transistor region, a portion of the carbon-containing layer 142 covering an NMOS transistor region of the substrate 110 may be exposed through the opening OP2. The detailed composition of the photoresist pattern PR12 is substantially the same as that of the photoresist pattern PR11 described with referenced to FIG. 1I. The details of a method of forming the silicon-containing organic anti-reflective pattern 144P are the same as those of forming the silicon-containing organic anti-reflective pattern 134P described with reference to FIG. 1I.

Referring to FIG. 1O, the carbon-containing layer 142 (see FIG. 1N) is etched using the silicon-containing organic anti-reflective pattern 144P as an etch mask to form a carbon-containing mask pattern 142P having an opening 142H exposing a portion of the top surface of the diffusion buffer layer 130.

Similarly to the method of forming the carbon-containing mask pattern 132P described above with reference to FIG. 1J, the carbon-containing layer 142 may be plasma-etched using the silicon-containing organic anti-reflective pattern 144P as an etch mask to form the carbon-containing mask pattern 142P.

While the carbon-containing layer 132 is being plasma-etched, oxygen atoms or by-products including oxygen atoms in an etching atmosphere may be diffused into other films. In some embodiments, during the formation of the carbon-containing mask pattern 142P, a second oxygen diffusion region 130E spaced apart from the bottom surface 130B of the diffusion buffer layer 130 may be formed in a portion of the diffusion buffer layer 130 exposed through the opening 142H. Although only one second oxygen diffusion region 130E is illustrated in FIG. 1O, a plurality of second oxygen diffusion regions 130E may be formed in the diffusion buffer layer 130 extending throughout the entire top surface of the substrate 110.

During the plasma etching of the carbon-containing layer 142, the fin-type active regions FA are protected by the diffusion buffer layer 130. Accordingly, while the carbon-containing mask pattern 142P is being formed by plasma etching the carbon-containing layer 142, oxygen atoms or by-products including oxygen atoms in the etching atmosphere of the carbon-containing layer 142 may be prevented, or reduced in likelihood, from diffusing into the fin-type active regions FA using the diffusion buffer layer 130. Therefore, even though etching of the carbon-containing layer 142 is performed in the etching atmosphere including oxygen atoms to form the carbon-containing mask pattern 142P, an adverse effect which the etching atmosphere may have on the fin-type active regions FA is effectually prevented, or reduced in likelihood, by the diffusion buffer layer 130, so that the fin-type active regions FA may be prevented, or reduced in likelihood, from being undesirably oxidized or damaged by the etching atmosphere, thereby having a stable profile.

The carbon-containing mask pattern 142P may have a width of at least 100 nm in the horizontal direction, e.g., the X direction. In some embodiments, an aspect ratio of the carbon-containing mask pattern 142P may be at least 3, for example, about 4 to 10, but is not limited thereto.

In some embodiments, the photoresist pattern PR12 (see FIG. 1N) on the silicon-containing organic anti-reflective pattern 144P may be consumed and removed during the etching of the carbon-containing layer 142. In some embodiments, after the carbon-containing mask pattern 142P is formed, the photoresist pattern PR12 may be removed to expose the top surface of the silicon-containing organic anti-reflective pattern 144P. In some embodiments, after the silicon-containing organic anti-reflective pattern 144P is formed, the photoresist pattern PR12 may be removed from the silicon-containing organic anti-reflective pattern 144P, and the carbon-containing layer 142 may be etched using the silicon-containing organic anti-reflective pattern 144P as an etch mask as described with reference to FIG. 1O.

Referring to FIG. 1P, impurity ions 146 are implanted into a second group of fin-type active regions FA, which are selected from among the plurality of the fin-type active regions FA excluding the first group of fin-type active regions FA, and the substrate 110 therebelow through the opening 142H of the carbon-containing mask pattern 142P and the diffusion buffer layer 130 to form a second well 148. The second well 148 may include an impurity region doped with the impurity ions 146. Although one second well 148 is shown in the current embodiments, a plurality of second wells 148 may be formed in the substrate 110.

Ion-implantation for forming the second well 148 is substantially similar to the method of forming the first wells 138 described above with reference to FIG. 1K.

In some embodiments, when each of the first wells 138 provides an active region for an NMOS transistor region, the second well 148 may provide an active region for a PMOS transistor region. In this case, the impurity ions 146 may be n-type dopant, and the second well 148 may be an n-type well doped with n-type dopant. In some embodiments, when each of the first wells 138 provides an active region for a PMOS transistor region, the second well 148 may provide an active region for an NMOS transistor region. In this case, the impurity ions 146 may be p-type dopant, and the second well 148 may be a p-type well doped with p-type dopant. However, inventive concepts are not limited thereto. For example, in some embodiments, when each of the first wells 138 provides an active region for a transistor with a first threshold voltage, the first transistor being a first conductivity type, each of the second wells 148 may be a well of the same conductivity type as each of the first wells 138, but having a different dopant concentration and/or different dopant depth than each of the first wells 138.

Referring to FIG. 1Q, the silicon-containing organic anti-reflective pattern 144P and the carbon-containing mask pattern 142P are removed from the resultant structure shown in FIG. 1P.

The method of removing the silicon-containing organic anti-reflective pattern 134P and the carbon-containing mask pattern 132P described above with reference to FIG. 1L may be used to remove the silicon-containing organic anti-reflective pattern 144P and the carbon-containing mask pattern 142P.

After the silicon-containing organic anti-reflective pattern 144P and the carbon-containing mask pattern 142P are removed, the top surfaces of the portions of the diffusion buffer layer 130, which have been covered with the carbon-containing mask pattern 142P, may be re-exposed. The diffusion buffer layer 130 exposed after the silicon-containing organic anti-reflective pattern 144P and the carbon-containing mask pattern 142P are removed may include the first regions 130A1 respectively including the first oxygen diffusion regions 130D and a second region 130A2 including the second oxygen diffusion region 130E.

Referring to FIG. 1R, the recesses RS may be emptied or exposed by removing the diffusion buffer layer 130.

Wet etch, dry etch, or a combination thereof may be used to remove the diffusion buffer layer 130. For example, when the diffusion buffer layer 130 is formed of polysilicon, an etchant including ammonia and hydrogen peroxide or an etchant including ammonium hydroxide ($NH_4OH$) and hydrogen peroxide may be used to remove the diffusion buffer layer 130. When the diffusion buffer layer 130 includes a silicon nitride layer, an etchant including phosphoric acid may be used. When the diffusion buffer layer 130 includes a silicon oxide layer, an etchant including hydrogen fluoride (HF) or an etchant including ammonium fluoride ($NH_4F$) may be used.

In some embodiments, after the diffusion buffer layer 130 is removed, the pad oxide film patterns 112 may be exposed through the recesses RS. In some embodiments, when the diffusion buffer layer 130 and the pad oxide film patterns 112 are formed of the same material or formed of materials having similar etching characteristics, the pad oxide film patterns 112 may be removed while the diffusion buffer layer 130 is being removed, so that the fin-type active regions FA may be exposed through the recesses RS.

Referring to FIG. 1S, the pad oxide film patterns 112 are removed, and a recess process for partially removing the isolation film 120 is performed to expose the top surface of each of the fin-type active regions FA.

In some embodiments, dry etch, wet etch, or a combination thereof may be used to perform the recess process. In some embodiments, during the recess process, the pad oxide film patterns 112 may also be removed. As the pad oxide film patterns 112 are removed, an upper portion of each of the fin-type active regions FA is exposed to an etching atmosphere of the recess process and/or a cleaning atmosphere following the etching and is thus partially consumed from an outer surface thereof. As a result, a width of the upper portion of each fin-type active region FA may be decreased, as shown in FIG. 1S.

Referring to FIG. 1T, a plurality of source/drain regions (not shown) are respectively formed on the fin-type active regions FA, and then a plurality of gate dielectric films 162, a plurality of gate lines 164, and a plurality of insulating capping films 166 may be formed on the fin-type active regions FA. A gate cut insulating film 168 may be formed between two adjacent gate lines 164 among the plurality of the gate lines 164. In some embodiments, the gate cut insulating film 168 may be formed before the gate dielectric films 162, the gate lines 164, and the insulating capping films 166 are formed, but inventive concepts are not limited thereto.

In some embodiments, the gate dielectric films 162 may include a silicon oxide film, a high dielectric film, or a combination thereof. The high dielectric film may be formed of a material having a greater dielectric constant than a silicon oxide film. The high dielectric film may be formed of metal oxide or metal oxynitride. In some embodiments, an interface layer (not shown) may be between the fin-type active regions FA and the gate dielectric films 162. The interface layer may include an oxide layer, a nitride layer, or an oxynitride layer.

The gate lines 164 may have a structure in which a metal nitride film, a metal film, a conductive capping film, and a gap-fill metal film are stacked, e.g. sequentially stacked. The metal nitride film and the metal film may include at least one metal selected from among Ti, Ta, W, Ru, Nb, Mo, and Hf. The gap-fill metal film may include a W film or an Al film. The gate lines 164 may include a work function metal film. The work function metal film may include at least one metal selected from among Ti, W, Ru, Nb, Mo, Hf, Ni, Co, Pt, Yb, Tb, Dy, Er, and Pd. In some embodiments, the gate lines 164 may have a stack structure of TiAlC/TiN/W, a stack structure of TiN/TaN/TiAlC/TiN/W, or a stack structure of TiN/TaN/TiN/TiAlC/TiN/W, but inventive concepts is not limited thereto.

The insulating capping films 166 and the gate cut insulating film 168 may include a nitride film, but inventive concepts is not limited thereto.

In some embodiments, a gate-last process, sometimes referred to as a replacement poly-gate (RPG) process, may be used to form the gate dielectric films 162, the gate lines 164, and the insulating capping films 166, but inventive concepts are not limited thereto.

According to the method of manufacturing an integrated circuit device which has been described above with reference to FIGS. 1A through 1T, when ion-implantation is performed to form a plurality of the first wells 138 and the second wells 148, which have a fine critical dimension (CD) due to down-scaling, the carbon-containing mask patterns 132P and 142P respectively obtained from the first and second mask stack structures MS11 and MS12 are used as ion-implantation masks, and therefore, the position and dimensional accuracy of the first and second wells 138 and 148 may be more precisely controlled. In addition, the fin-type active regions FA are protected by the diffusion buffer layer 130 while the carbon-containing layers 132 and 142 are being plasma-etched to form the carbon-containing mask patterns 132P and 142P, as described with reference to FIGS. 1J and 1O, so that oxygen atoms or by-products including oxygen atoms in the etching atmosphere of the carbon-containing layers 132 and 142 may be prevented, or reduced in likelihood, from diffusing into the fin-type active regions FA using the diffusion buffer layer 130. Accordingly, even though etching of the carbon-containing layers 132 and 142 is performed in an etching atmosphere including oxygen atoms to form the carbon-containing mask patterns 132P and 142P, an adverse effect which the etching atmosphere may have on the fin-type active regions FA is effectually prevented, or reduced in likelihood, by the diffusion buffer layer 130, so that the fin-type active regions FA may be prevented, or reduced in likelihood, from being undesirably oxidized or damaged by the etching atmosphere, thereby having a stable profile.

FIGS. 2A through 2H are cross-sectional views of the stages in a method of manufacturing an integrated circuit device, according to other embodiments of inventive concepts. In FIGS. 1A through 2H, like reference numerals denote like elements, and thus descriptions thereof will be omitted.

Figure 2A:
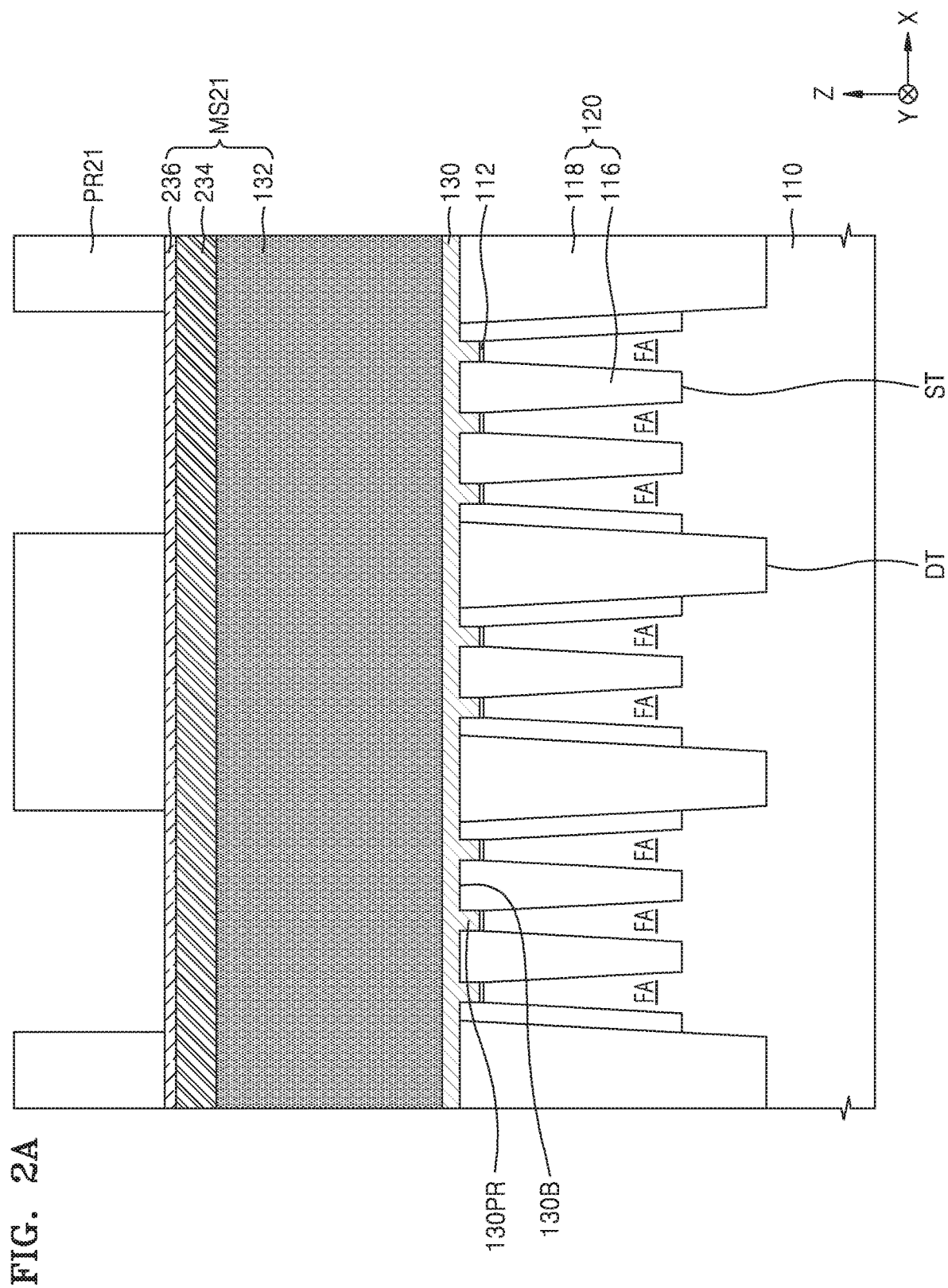

Referring to FIG. 2A, after the diffusion buffer layer 130 is formed using the method described with reference to FIGS. 1A through 1G, a first mask stack structure MS21 including multiple layers is formed on the diffusion buffer layer 130, and then a photoresist pattern PR21 is formed on the first mask stack structure MS21.

The first mask stack structure MS21 may include the carbon-containing layer 132, a hardmask layer 234, and an anti-reflective layer 236, which sequentially cover the diffusion buffer layer 130. The detailed composition of the carbon-containing layer 132 has been described with reference to FIG. 1H.

The diffusion buffer layer 130, the carbon-containing layer 132, and the hardmask layer 234 may be formed of different materials to have different etching characteristics. In some embodiments, the hardmask layer 234 may be formed of silicon oxide, silicon nitride, polysilicon, or a combination thereof, but inventive concepts is not limited thereto.

In some embodiments, the diffusion buffer layer 130 may be formed of silicon oxide and the hardmask layer 234 may be formed of silicon nitride. In some embodiments, the diffusion buffer layer 130 may be formed of silicon nitride and the hardmask layer 234 may be formed of silicon oxide. The hardmask layer 234 may be formed to have a thickness of about 200 Å (20 nm) to about 1000 Å (100 nm), but inventive concepts are not limited thereto.

The anti-reflective layer 236 may include an organic anti-reflective layer, an inorganic anti-reflective layer, or a combination thereof. In some embodiments, the organic anti-reflective layer may be formed using a bottom anti-reflective coating (BARC) composite. The inorganic anti-reflective layer may be formed of SiON. In some embodiments, the anti-reflective layer 236 may be omitted.

The detailed composition of the photoresist pattern PR21 is substantially the same as that of the photoresist pattern PR11 described with reference to FIG. 1I.

Figure 2B:
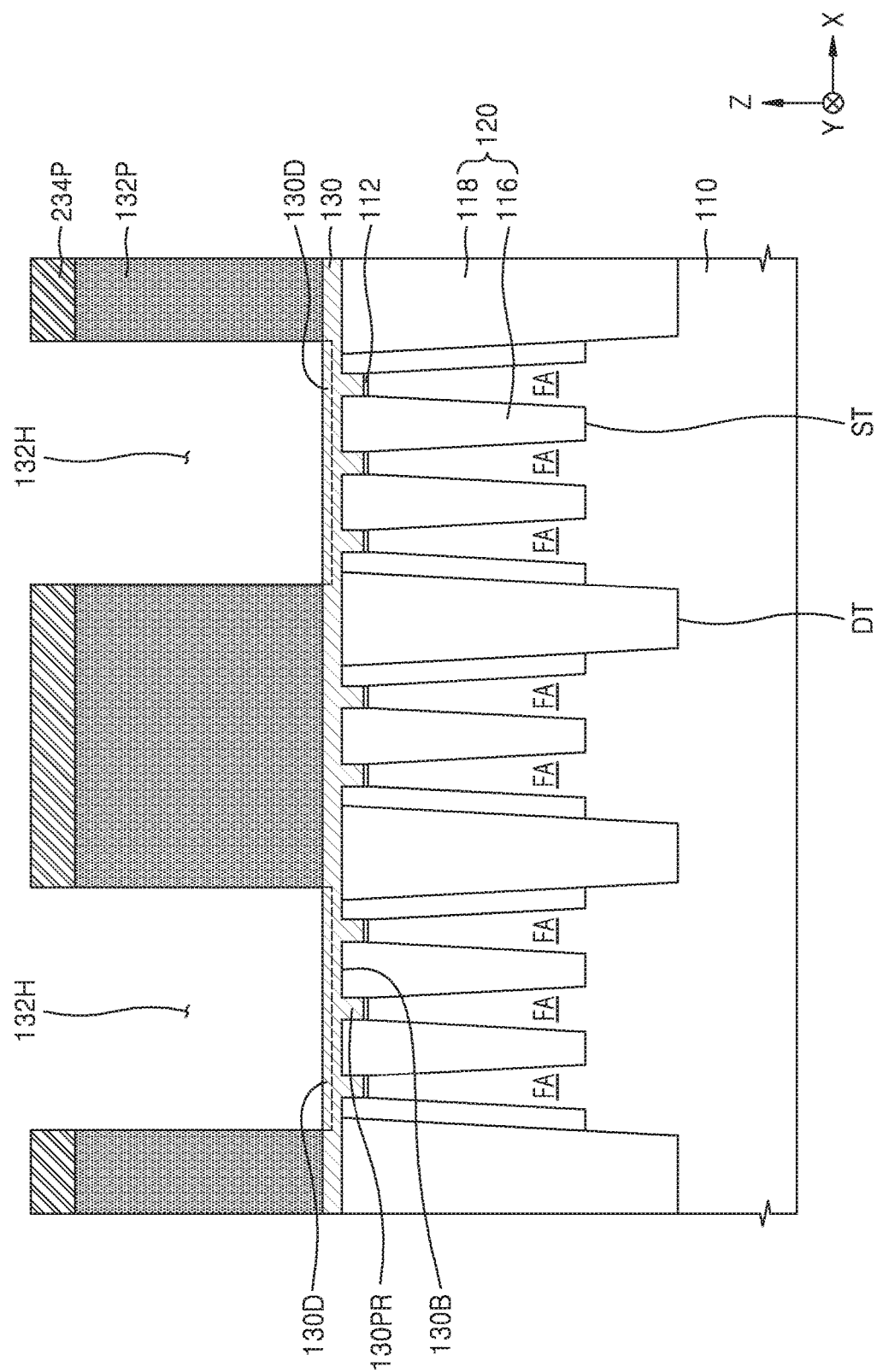

Referring to FIG. 2B, the anti-reflective layer 236 (see FIG. 2A) and the hardmask layer 234 are etched using the photoresist pattern PR21 as an etch mask. The carbon-containing layer 132 is etched using a hardmask pattern 234P, which is obtained by etching the hardmask layer 234, as an etch mask to form the carbon-containing mask pattern 132P having the openings 132H exposing the top surfaces of some portions of the diffusion buffer layer 130.

In some embodiments, during the formation of the carbon-containing mask pattern 132P, a plurality of the first oxygen diffusion regions 130D spaced apart from the bottom surface 130B of the diffusion buffer layer 130 may be respectively formed in the portions of the diffusion buffer layer 130 exposed through the openings 132H, respectively.

The details of the etching of the carbon-containing layer 132 have been described with reference to FIG. 1J. After the carbon-containing mask pattern 132P is formed, the photoresist pattern PR21 and a residue of the anti-reflective layer 236 therebelow are removed to expose the top surface of the hardmask pattern 234P.

Referring to FIG. 2C, the hardmask pattern 234P is selectively removed from the resultant structure shown in FIG. 2B.

In some embodiments, wet etch may be used to selectively remove the hardmask pattern 234P.

Figure 2D:
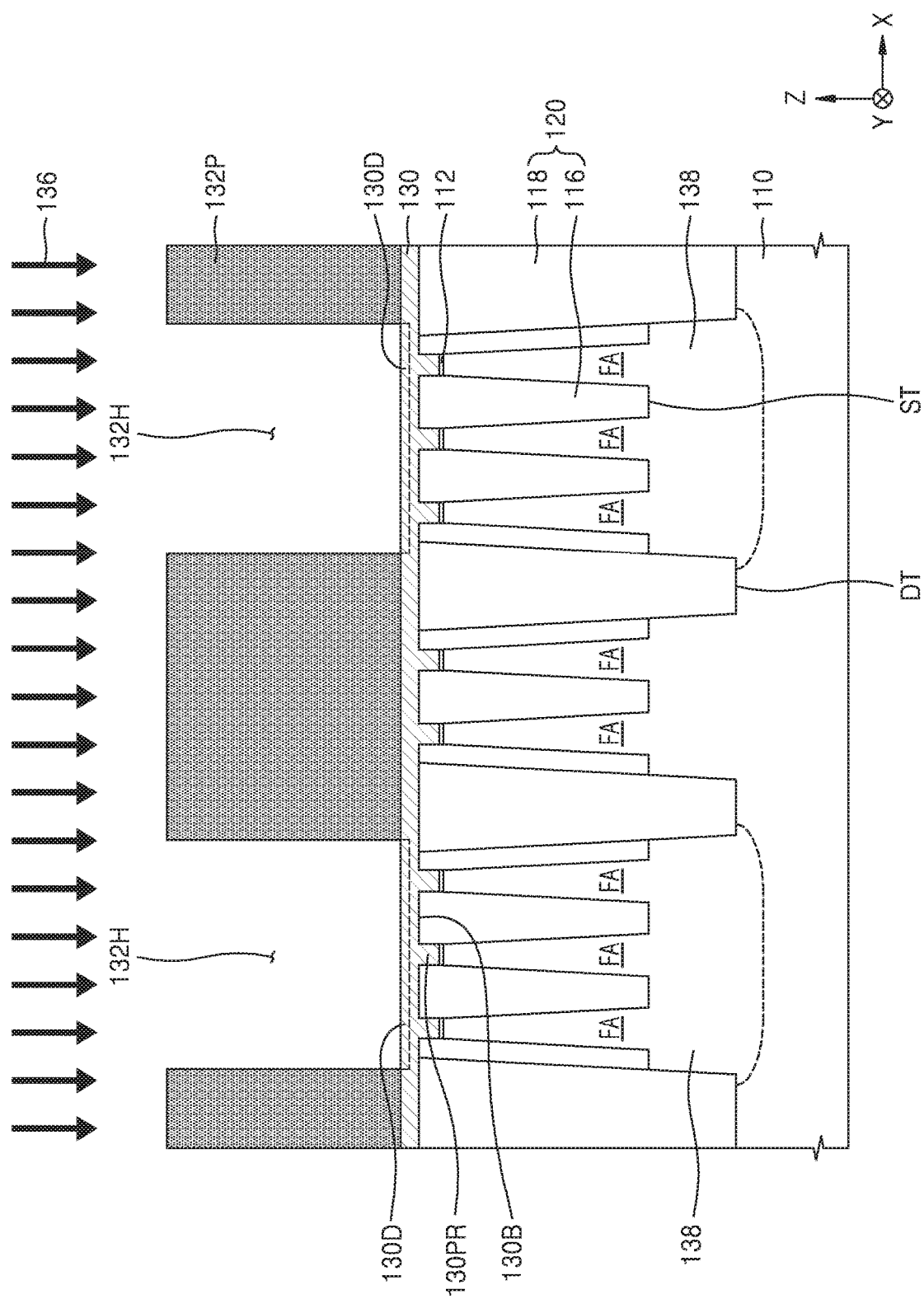

Referring to FIG. 2D, the impurity ions 136 are implanted into the first group of fin-type active regions FA, which are selected from among the plurality of the fin-type active regions FA, and the substrate 110 therebelow through the openings 132H of the carbon-containing mask pattern 132P and the diffusion buffer layer 130 to form a plurality of the first wells 138, using the same method as described above with reference to FIG. 1K.

Figure 2E:
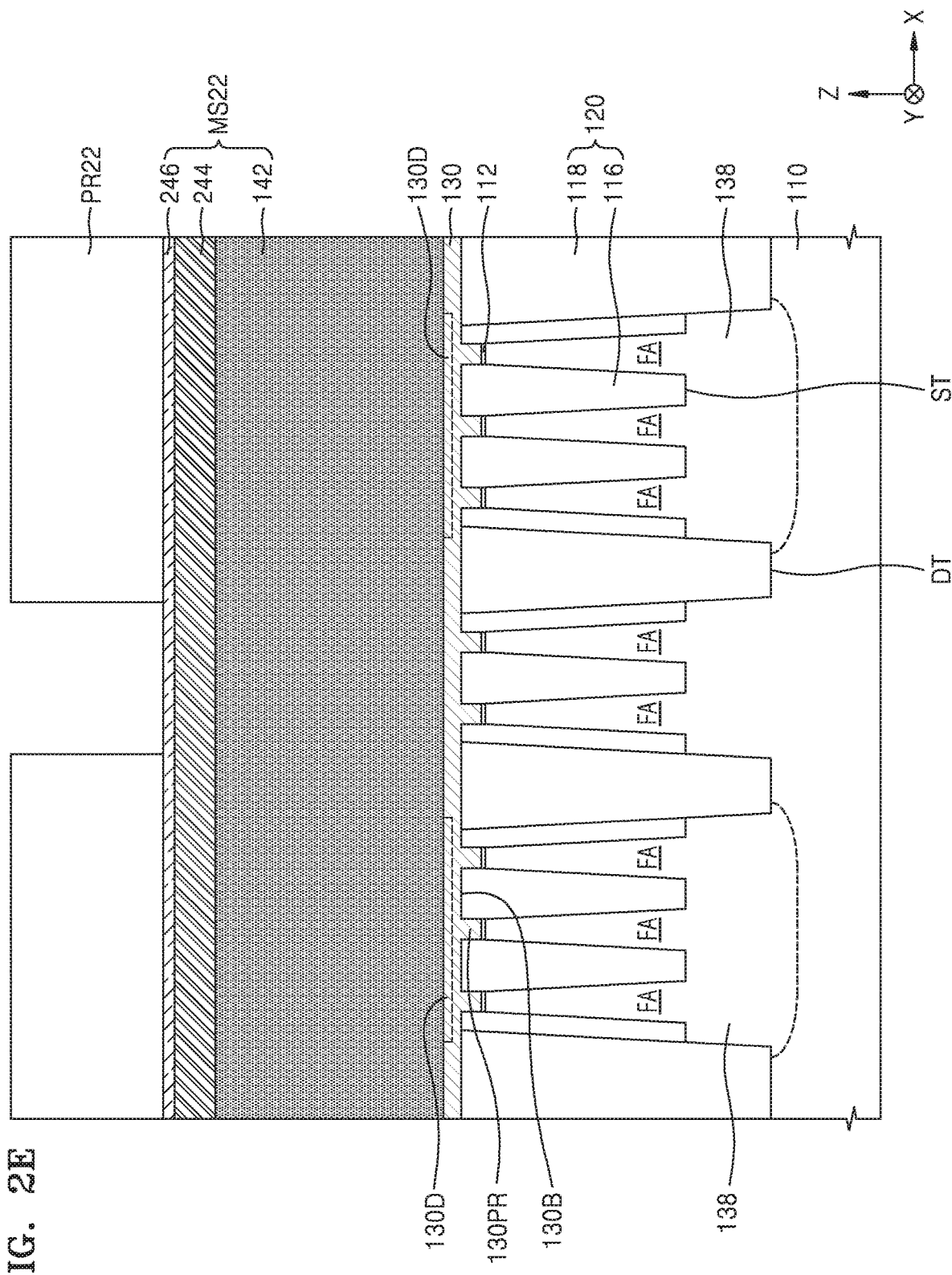

Referring to FIG. 2E, the carbon-containing mask pattern 132P is removed from the resultant structure shown in FIG. 2D using the same method as described above with reference to FIG. 1L. Thereafter, a second mask stack structure MS22 including multiple layers is formed on the diffusion buffer layer 130, and then a photoresist pattern PR22 is formed on the second mask stack structure MS22, using the same method as described above with reference to FIG. 2A.

The second mask stack structure MS22 may include the carbon-containing layer 142, a hardmask layer 244, and an anti-reflective layer 246, which sequentially cover the diffusion buffer layer 130. The detailed compositions of the hardmask layer 244 and the anti-reflective layer 246 are substantially the same as those of the hardmask layer 234 and the anti-reflective layer 236 described above with reference to FIG. 2A. The detailed composition of the photoresist pattern PR22 is substantially the same as that of the photoresist pattern PR21 described with reference to FIG. 1N. In some embodiments, the anti-reflective layer 246 may be omitted.

Figure 2F:
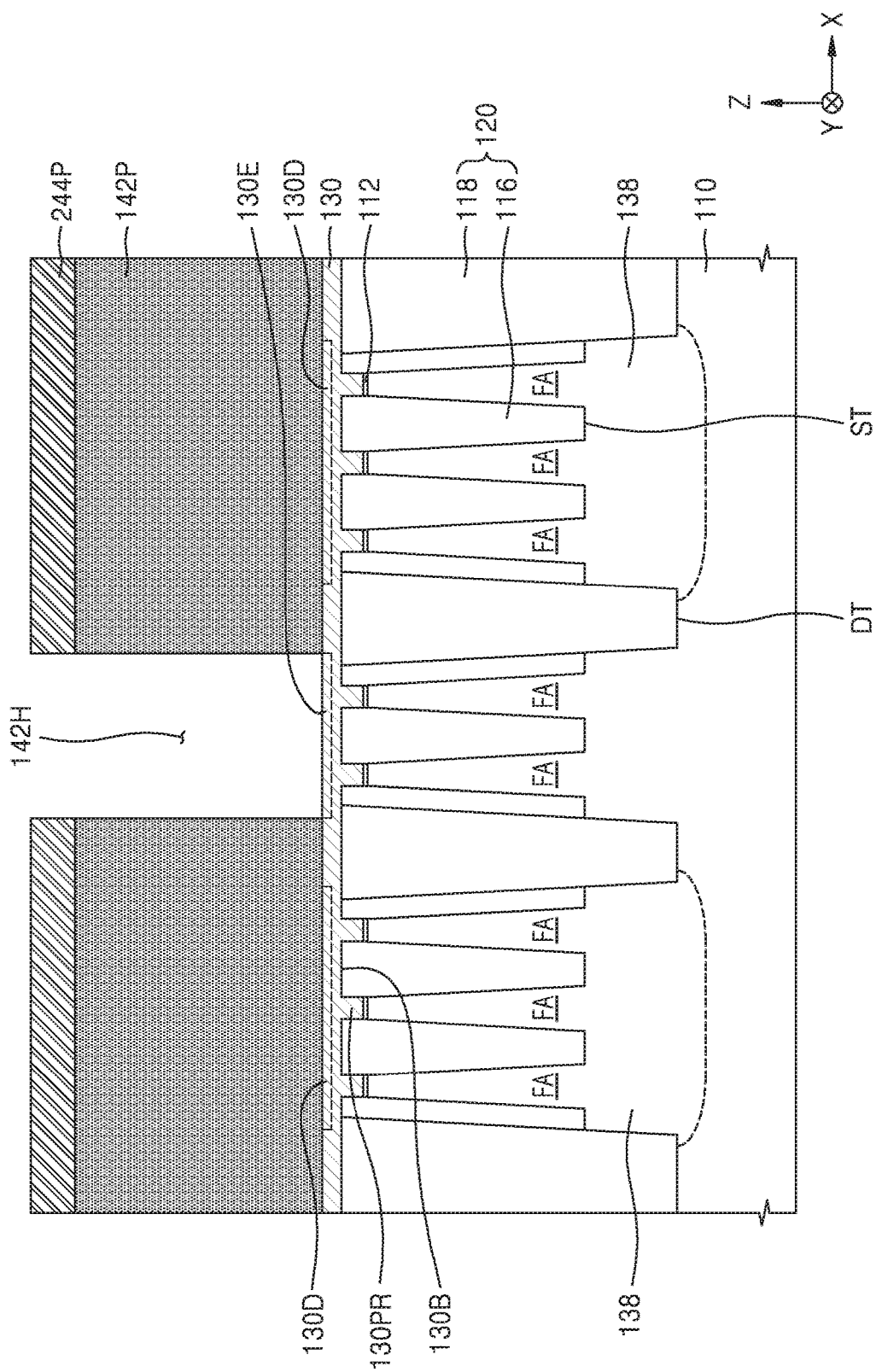

Referring to FIG. 2F, the anti-reflective layer 246 (see FIG. 2E) and the hardmask layer 244 are etched using the photoresist pattern PR22 (see FIG. 2E) as an etch mask. The carbon-containing layer 142 is etched using a hardmask pattern 244P, which is obtained by etching the hardmask layer 244, as an etch mask to form the carbon-containing mask pattern 142P having the opening 142H exposing the top surface of another portion of the diffusion buffer layer 130.

In some embodiments, during the formation of the carbon-containing mask pattern 142P, the second oxygen diffusion region 130E spaced apart from the bottom surface 130B of the diffusion buffer layer 130 may be formed in the portion of the diffusion buffer layer 130 exposed through the opening 142H.

The details of the etching of the carbon-containing layer 142 have been described with reference to FIG. 1O. After the carbon-containing mask pattern 142P is formed, the photoresist pattern PR22 and a residue of the anti-reflective layer 246 therebelow are removed to expose the top surface of the hardmask pattern 244P.

Figure 2G:
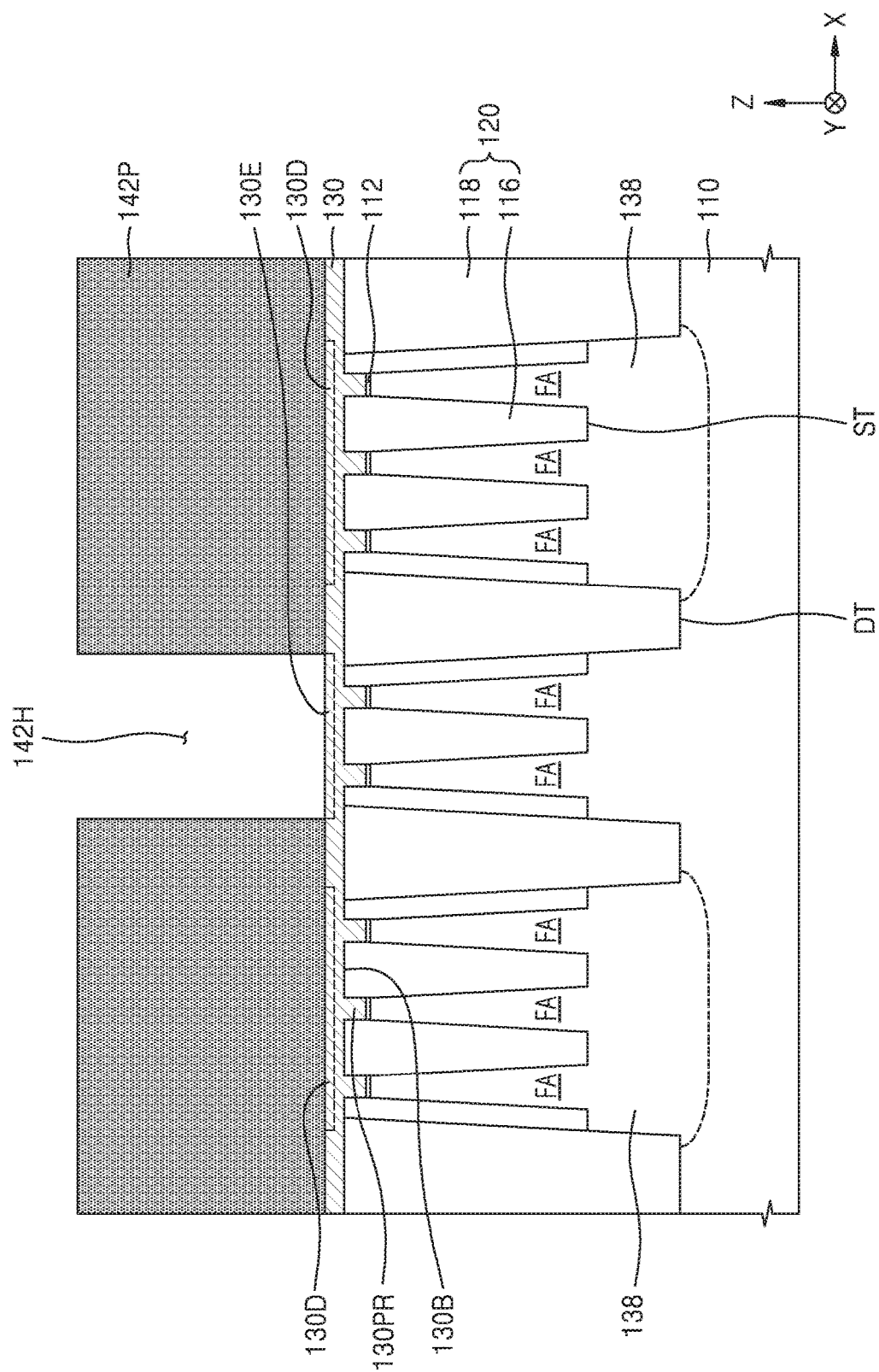

Referring to FIG. 2G, the hardmask pattern 244P is selectively removed from the resultant structure shown in FIG. 2F. In some embodiments, wet etch may be used to selectively remove the hardmask pattern 244P.

Figure 2H:
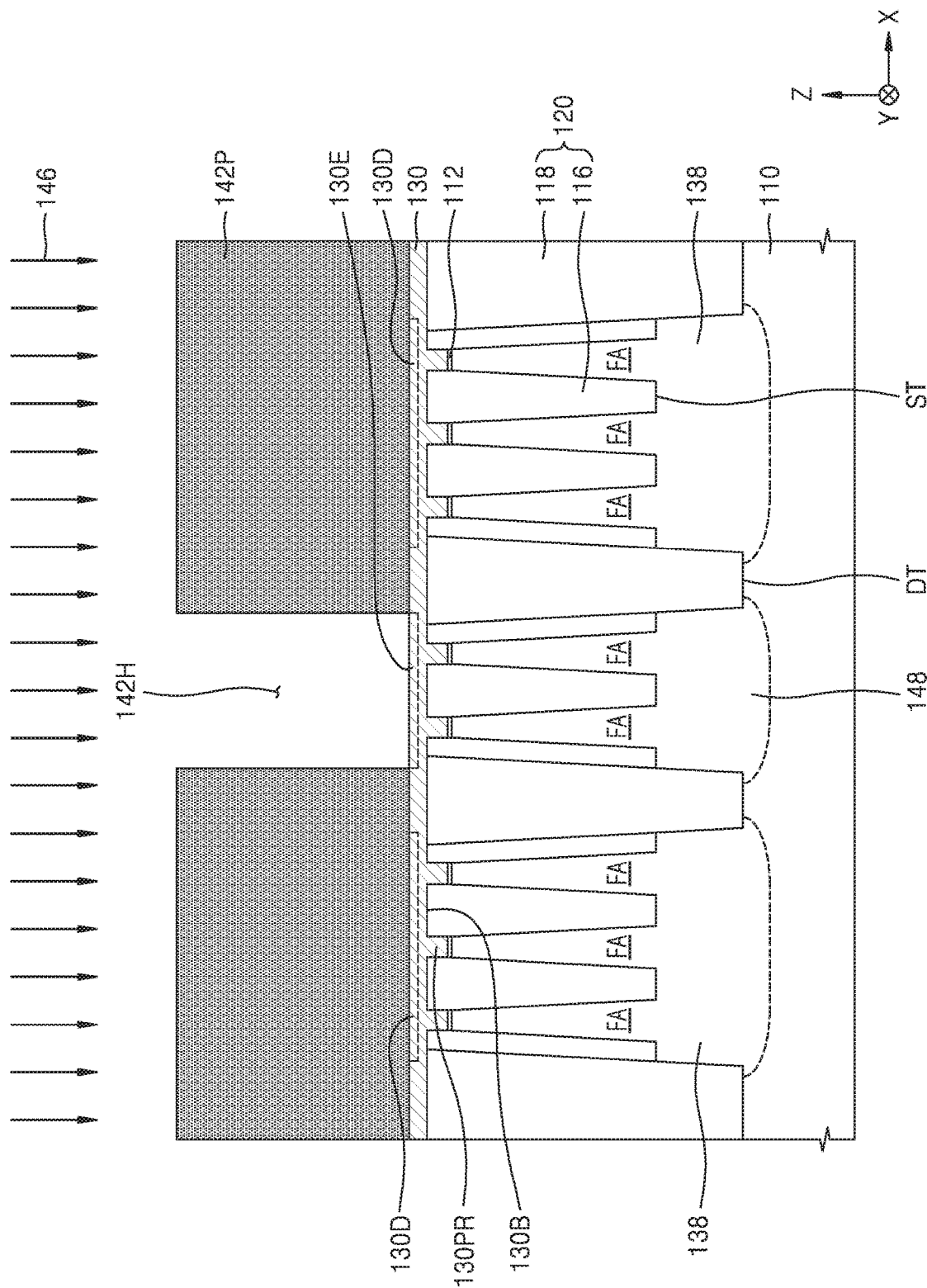

Referring to FIG. 2H, the impurity ions 146 are implanted into the second group of fin-type active regions FA, which are selected from among the plurality of the fin-type active regions FA, at least some of which exclude the first group of fin-type active regions FA, and the substrate 110 therebelow through the opening 142H of the carbon-containing mask pattern 142P and the diffusion buffer layer 130 to form the second well 148, using the same method as described above with reference to FIG. 1P.

Thereafter, the carbon-containing mask pattern 142P is removed from the resultant structure shown in FIG. 2H. The diffusion buffer layer 130 is removed using the same method as described above with reference to FIG. 1R. Thereafter, an integrated circuit device may be manufactured by performing the processes described above with reference to FIGS. 1S and 1T.

Although methods of manufacturing an integrated circuit device according to some embodiments of inventive concepts have been described with reference to FIGS. 1 through 2H, integrated circuit devices having various structures may be manufactured from these embodiments without departing from the scope of inventive concepts. Although the methods of manufacturing an integrated circuit device including a fin field effect transistor (FinFET) having a three-dimensional (3D) channel have been described with reference to FIGS. 1A through 2H, inventive concepts are not limited thereto. For example, a method of manufacturing an integrated circuit device according to some embodiments of inventive concepts may be applied to a method of manufacturing an integrated circuit device including a planar MOSFET by modifying and changing the embodiments of inventive concepts in various ways without departing from the scope of inventive concepts.

Figure 3A:
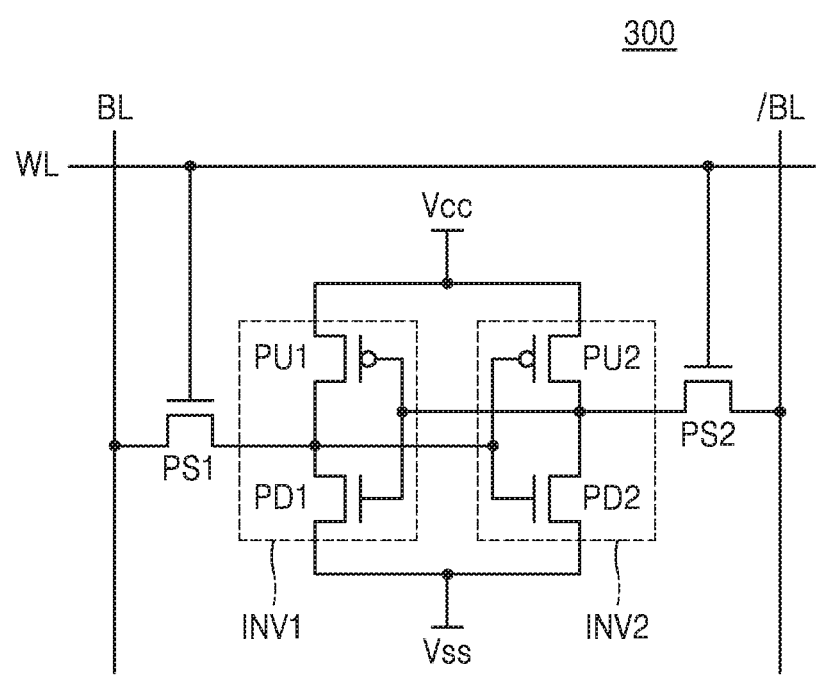
FIG. 3A is a circuit diagram of an example integrated circuit device which can be manufactured using a method of manufacturing an integrated circuit device, according to some embodiments of inventive concepts.

FIG. 3A is a circuit diagram of an example integrated circuit device 300 which can be manufactured using a method of manufacturing an integrated circuit device, according to some embodiments of inventive concepts. FIG. 3A is a circuit diagram of a 6-transistor (T) static random access memory (SRAM) cell including six transistors.

Referring to FIG. 3A, the integrated circuit device 300 may include a pair of first and second inverters INV1 and INV2, which are connected in parallel between a power supply node Vcc and a ground node Vss, and a first pass transistor PS1 and a second pass transistor PS2, which are respectively connected to output nodes of the respective first and second inverters INV1 and INV2. The first pass transistor PS1 and the second pass transistor PS2 may be respectively connected to a bit line BL and a complementary bit lint/BL. A gate of each of the first and second pass transistors PS1 and PS2 may be connected to a word line WL.

The first inverter INV1 may include a first pull-up transistor PU1 and a first pull-down transistor PD1 which are connected in series to each other. The second inverter INV2 may include a second pull-up transistor PU2 and a second pull-down transistor PD2 which are connected in series to each other. Each of the first and second pull-up transistors PU1 and PU2 may be a PMOS transistor, and each of the first and second pull-down transistors PD1 and PD2 may be an NMOS transistor.

An input node of the first inverter INV1 may be connected to an output node of the second inverter INV2 and an input node of the second inverter INV2 may be connected to an output node of the first inverter INV1 so that the first inverter INV1 and the second inverter INV2 may form a single latch circuit.

Figure 3B:
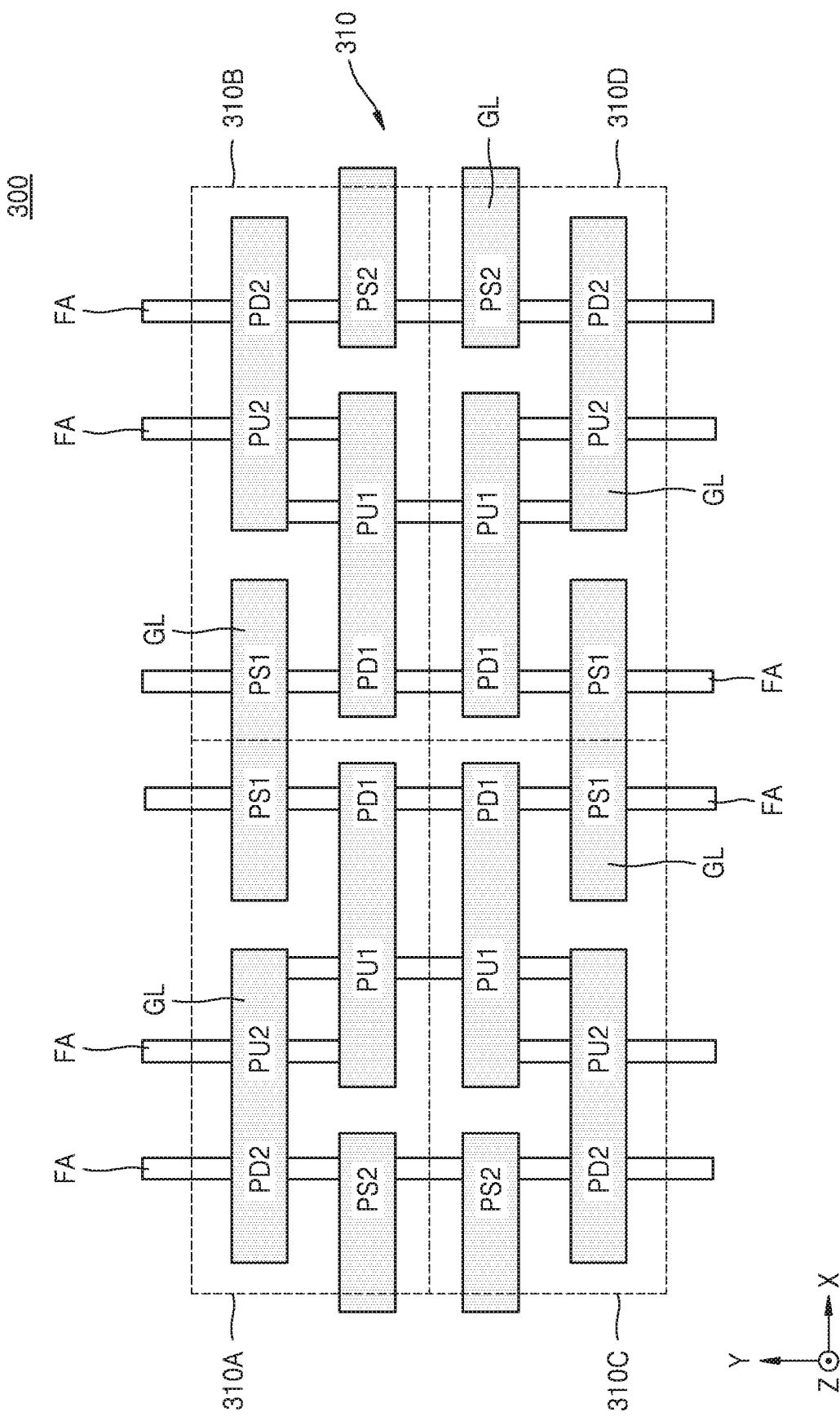
FIG. 3B is a plan view of main elements of the integrated circuit device shown in FIG. 3A.

FIG. 3B is a plan view of main elements of the integrated circuit device 300 shown in FIG. 3A.

Referring to FIG. 3B, the integrated circuit device 300 includes an SRAM array 310 including a plurality of SRAM cells 310A, 310B, 310C, and 310D arranged in a matrix on a substrate. FIG. 3B shows four SRAM cells 310A, 310B, 310C, and 310D each including six FinFETs. Each of the SRAM cells 310A, 310B, 310C, and 310D may have the configuration shown in FIG. 3A.

Each of the SRAM cells 310A, 310B, 310C, and 310D includes a plurality of fin-type active regions FA protruding from a substrate, e.g., the substrate 110 shown in FIGS. 1A through 1T, and extending in one direction (i.e., the Y direction) to be parallel to one another.

In each of the SRAM cells 310A, 310B, 310C, and 310D, a plurality of gate lines GL may extend in a direction (i.e., the X direction) crossing the fin-type active regions FA to cover top portions of the fin-type active regions FA. In each of the SRAM cells 310A, 310B, 310C, and 310D, distances among the fin-type active regions FA may be regular or different according to the positions thereof.

The first pull-up transistor PU1, the first pull-down transistor PD1, the first pass transistor PS1, the second pull-up transistor PU2, the second pull-down transistor PD2, and the second pass transistor PS2, which form each of the SRAM cells 310A, 310B, 310C, and 310D, may be respectively implemented as a plurality of FinFET devices respectively formed at intersections between the fin-type active regions FA and the gate lines GL.

For example, in the SRAM cell 310A, transistors may be respectively formed at six intersections between the fin-type active regions FA and the gate lines GL and may include the first pass transistor PS1, the second pass transistor PS2, the first pull-down transistor PD1, the second pull-down transistor PD2, the first pull-up transistor PU1, and the second pull-up transistor PU2.

The first pull-up transistor PU1 and the second pull-up transistor PU2 each may be or include a PMOS transistor. The first pull-down transistor PD1, the second pull-down transistor PD2, the first pass transistor PS1, and the second pass transistor PS2 each may be or include an NMOS transistor.

At least one of the methods described with reference to FIGS. 1A through 2H may be used to manufacture the integrated circuit device 300.

Figure 4:
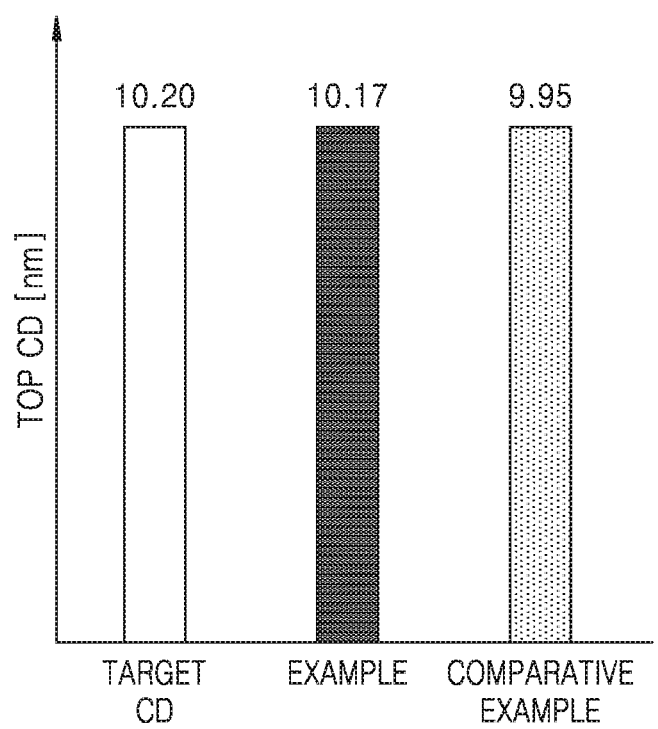
FIG. 4 is a graph showing the result of evaluating the effect of inhibiting the oxidation of fin-type active regions by a diffusion buffer layer used in a method of manufacturing an integrated circuit device, according to some embodiments of inventive concepts.

FIG. 4 is a graph showing the result of evaluating the effect of inhibiting the oxidation of the fin-type active regions FA by the diffusion buffer layer 130 used in a method of manufacturing an integrated circuit device, according to some embodiments of inventive concepts.

For the evaluation shown in FIG. 4, a plurality of the fin-type active regions FA were formed on the substrate 110 using the method described with reference to FIGS. 1A through 1S. In detail, a thermal oxide film having a thickness of 35 Å (3.5 nm) was formed to form the pad oxide film patterns 112, and a $SiO_2$ film having a thickness of 100 Å (10 nm) was formed on the pad oxide film patterns 112 using ALD to form the diffusion buffer layer 130. Each of the first and second mask stack structures MS11 and MS12 respectively shown in FIGS. 1H and 1M was formed in a stack structure of a SOH layer formed on the diffusion buffer layer 130 and a SiARC layer formed on the SOH layer, wherein the SOH layer had a thickness of 6000 Å (600 nm) and the SiARC layer had a thickness of 800 Å (80 nm). The first mask stack structure MS11 was patterned using the method described with reference to FIGS. 1I and 1J. A plurality of the first wells 138 including n-wells were formed by implanting P ions and As ions, i.e., n-type dopant, into the substrate 110 using the method described with reference to FIG. 1K. The second mask stack structure MS12 was patterned using the method described with reference to FIGS. 1N and 1O. A plurality of the second wells 148 including p-wells were formed by implanting B ions and In ions, i.e., p-type dopant, into the substrate 110 using the method described with reference to FIG. 1P. Thereafter, the diffusion buffer layer 130 was removed using the method described with reference to FIG. 1R, and a recess process for removing the pad oxide film patterns 112 and part of the isolation film 120 was performed using the method described with reference to FIG. 1S to expose the upper portions of the fin-type active regions FA.

After the recess process, a CD of a top portion of an exposed upper portion of each of the fin-type active regions FA was measured at thirteen different positions on the substrate 110, and an arithmetic mean of CDs measured at the thirteen different positions was calculated.

As a comparative example, the same processes as those used in the example of evaluation were performed up to the recess process performed on the isolation film 120 to expose the upper portions of the fin-type active regions FA, except for the process of forming the diffusion buffer layer 130. Thereafter, CDs of top portions of the exposed upper portions of the fin-type active regions FA were measured, and an arithmetic mean of the measured CDs was calculated and shown in FIG. 4

Referring to the result shown in FIG. 4, the CD of the top portion of each fin-type active region FA obtained in case EXAMPLE where the diffusion buffer layer 130 was formed and the impurity ions 136 and 146 were respectively implanted into the substrate 110 through the diffusion buffer layer 130 using ion-implantation masks respectively obtained from the first and second mask stack structures MS11 and MS12, according to some embodiments of inventive concepts, is closer to a target CD (e.g., 10.20 Å) than a CD of a top portion of each fin-type active region FA obtained in the comparative example.

When ion-implantation is performed using the carbon-containing mask patterns 132P and 142P respectively obtained from the first and second mask stack structures MS11 and MS12 as ion-implantation masks to more precisely control the position and dimensional accuracy of the first and second wells 138 and 148, the first mask stack structure MS11 and the second mask stack structure MS12 are formed on the diffusion buffer layer 130 which has already been formed on the substrate 110, so that oxygen atoms or by-products including oxygen atoms in the etching atmosphere of the carbon-containing layers 132 and 142 may be prevented, or reduced in likelihood, from diffusing into the fin-type active regions FA by the diffusion buffer layer 130 while the carbon-containing layers 132 and 142 are being plasma-etched, as described above with reference to FIGS. 1J and 1O, to form the carbon-containing mask patterns 132P and 142P. As a result, the fin-type active regions FA may be prevented, or reduced in likelihood, from being undesirably oxidized or damaged by the etching atmosphere, thereby having a stable profile.

While inventive concepts has been particularly shown and described with reference to embodiments thereof, it will be understood that various changes in form and details may be made therein without departing from the spirit and scope of the following claims.

What is claimed is:

1. A method of manufacturing an integrated circuit device, the method comprising:
  forming a plurality of fin-type active regions in a substrate;
  forming a diffusion buffer layer on the fin-type active regions to block oxygen from diffusing into the fin-type active regions, the diffusion buffer layer having a top surface with a planar profile and a bottom surface under the top surface, the bottom surface having a different profile than the planar profile of the top surface;
  forming a carbon-containing layer on the diffusion buffer layer;
  forming a carbon-containing mask pattern to have an opening exposing a portion of the diffusion buffer layer by etching the carbon-containing layer using an etching gas including an oxygen atom; and
  implanting impurity ions into a subset of the fin-type active regions through the opening and the diffusion buffer layer using the carbon-containing mask pattern as an ion-implantation mask.

2. The method of claim 1, wherein the diffusion buffer layer includes at least one of silicon oxide, silicon nitride, silicon oxynitride, silicon carbonitride, silicon carbide, silicon oxycarbide, silicon oxycarbonitride, or polysilicon.

3. The method of claim 1, further comprising:
  forming an isolation film to fill space among the fin-type active regions after the forming of the fin-type active regions and before the forming of the diffusion buffer layer,
  wherein a thickness of a first portion of the diffusion buffer layer covering the fin-type active regions is greater than a thickness of a second portion of the diffusion buffer layer covering the isolation film.

4. The method of claim 1, wherein the forming of the carbon-containing mask pattern comprises etching the carbon-containing layer using an etching gas including at least one of COS or $SO_2$.

5. The method of claim 1, during the forming of the carbon-containing mask pattern, further comprising forming an oxygen diffusion region in the diffusion buffer layer to be spaced apart from a bottom surface of the diffusion buffer layer.

6. A method of manufacturing an integrated circuit device, the method comprising:

forming a diffusion buffer layer on a substrate having a plurality of fin-type active regions, the diffusion buffer layer having a top surface with a planar profile and a bottom surface under the top surface, the bottom surface having a different profile than the planar profile of the top surface;

forming a first mask stack structure on the diffusion buffer layer;

forming a first mask pattern to have a first opening exposing a first region of the diffusion buffer layer and to cover a second region of the diffusion buffer layer by etching the first mask stack structure;

implanting first impurity ions into a first subset of the fin-type active regions through the first opening and the first region of the diffusion buffer layer using the first mask pattern as an ion-implantation mask; and exposing the second region of the diffusion buffer layer by removing the first mask pattern.

7. The method of claim 6, wherein
the first mask stack structure comprises a carbon-containing layer, and
the forming of the first mask pattern comprises etching the carbon-containing layer in an etching atmosphere including an oxygen atom.

8. The method of claim 6, during the forming of the first mask pattern further comprising forming a first oxygen diffusion region in the first region of the diffusion buffer layer to be spaced apart from a bottom surface of the diffusion buffer layer.

9. The method of claim 6, wherein a thickness from portions of the diffusion buffer layer covering the plurality of fin-type active regions to the top surface having the planar profile is greater than a thickness from a portion of the diffusion buffer layer covering space among the plurality of fin-type active regions to the top surface having the planar profile.

10. The method of claim 6, wherein the diffusion buffer layer includes at least one of silicon oxide, silicon nitride, silicon oxynitride, silicon carbonitride, silicon carbide, silicon oxycarbide, silicon oxycarbonitride, or polysilicon.

11. The method of claim 6, wherein the first mask stack structure comprises a carbon-containing layer and a silicon-containing organic anti-reflective layer which are sequentially formed on the diffusion buffer layer, and
the forming of the first mask pattern comprises etching the carbon-containing layer using an etching gas including at least one of COS or $SO_2$.

12. The method of claim 6, wherein
the first mask stack structure comprises a carbon-containing layer and a hardmask layer which are sequentially formed on the diffusion buffer layer, and
the forming of the first mask pattern comprises etching the carbon-containing layer using an etching gas including at least one of COS or $SO_2$.

13. The method of claim 12, wherein the diffusion buffer layer comprises a material different from the hardmask layer.

14. The method of claim 6, after the exposing of the second region of the diffusion buffer layer, further comprising:
forming a second mask stack structure to cover the first region and the second region of the diffusion buffer layer;
forming a second mask pattern to have a second opening exposing the second region of the diffusion buffer layer and to cover the first region of the diffusion buffer layer by etching the second mask stack structure; and implanting second impurity ions into a second subset of fin-type active regions through the second opening and the second region of the diffusion buffer layer using the second mask pattern as an ion-implantation mask.

15. The method of claim 14, wherein
the second mask stack structure comprises a carbon-containing layer, and
the forming of the second mask stack structure comprises etching the carbon-containing layer in an etching atmosphere including an oxygen atom and forming an oxygen diffusion region in the second region of the diffusion buffer layer to be spaced apart from a bottom surface of the diffusion buffer layer.

16. A method of manufacturing an integrated circuit device, the method comprising:
forming a plurality of fin-type active regions extending in parallel with each other by partially etching a substrate;
forming an insulating film to fill spaces among the plurality of fin-type active regions;
forming a diffusion buffer layer on the plurality of fin-type active regions and the insulating film to block oxygen from diffusing into the fin-type active regions, the diffusion buffer layer having a top surface with a planar profile and a bottom surface under the top surface, the bottom surface having a different profile than the planar profile of the top surface;
forming a mask stack structure having multiple layers on the diffusion buffer layer;
forming a mask pattern to have an opening exposing a portion of the diffusion buffer layer by etching the mask stack structure; and
forming a well in a subset of the fin-type active regions by implanting impurity ions into the subset of fin-type active region through the opening and the diffusion buffer layer using the mask pattern as an ion-implantation mask.

17. The method of claim 16, wherein a thickness from a portion of the diffusion buffer layer covering the plurality of fin-type active regions to the top surface having the planar profile is greater than a thickness from a portion of the diffusion buffer layer covering the insulating film to the top surface having the planar profile.

18. The method of claim 16, wherein
the mask stack structure comprises a carbon-containing layer, a silicon-containing organic anti-reflective layer, and a photoresist pattern which are sequentially stacked on the diffusion buffer layer, and
the forming of the mask pattern includes,
forming a silicon-containing organic anti-reflective pattern by etching the silicon-containing organic anti-reflective layer using the photoresist pattern as an etch mask, and
forming a carbon-containing mask pattern by etching the carbon-containing layer using the silicon-containing organic anti-reflective pattern as an etch mask.

19. The method of claim 16, wherein
the mask stack structure comprises a carbon-containing layer, a hardmask layer, and a photoresist pattern which are sequentially stacked on the diffusion buffer layer, the hardmask layer being formed of a different material than the diffusion buffer layer, and
the forming of the mask pattern includes,
forming a hardmask pattern by etching the hardmask layer using the photoresist pattern as an etch mask, forming a carbon-containing mask pattern exposing the diffusion buffer layer by etching the carbon-containing layer using the hardmask pattern as an etch mask, and removing the hardmask pattern.

20. The method of claim 16, further comprising:
exposing a top surface of the diffusion buffer layer by wet etching the mask pattern after the forming of the well.

\* \* \* \* \*